United States Patent [19]

Ishii

[11] Patent Number: 4,970,580
[45] Date of Patent: Nov. 13, 1990

[54] SEMICONDUCTOR MEMORY DEVICE HAVING PROTRUDING CELL CONFIGURATION

[75] Inventor: Tatsuya Ishii, Hyogo, Japan

[73] Assignee: Mitsubishi Denki Kabushiki Kaisha, Tokyo, Japan

[21] Appl. No.: 269,762

[22] Filed: Nov. 10, 1988

[30] Foreign Application Priority Data

Nov. 28, 1987 [JP] Japan .................. 62-300373

[51] Int. Cl.$^5$ .................. H01L 29/68; H01L 29/06; H01L 27/02
[52] U.S. Cl. .................. 357/236; 357/55; 357/41
[58] Field of Search .................. 357/23.6

[56] References Cited

U.S. PATENT DOCUMENTS

| 4,672,410 | 6/1987 | Miura et al. ............. 357/23.6 |
| 4,887,136 | 12/1989 | Matsuda et al. .......... 357/23.6 |

FOREIGN PATENT DOCUMENTS

| 0066081 | 12/1982 | European Pat. Off. . |
| 0145606 | 6/1985 | European Pat. Off. . |
| 198590 | 10/1986 | European Pat. Off. ........... 357/23.6 |
| 221380 | 5/1987 | European Pat. Off. ........... 357/23.6 |
| 3525418A1 | 1/1986 | Fed. Rep. of Germany . |
| 3707195A1 | 9/1987 | Fed. Rep. of Germany . |
| 3809563A1 | 10/1988 | Fed. Rep. of Germany . |
| 144060 | 7/1986 | Japan .................. 357/23.6 |
| 285752 | 12/1986 | Japan .................. 357/23.6 |

OTHER PUBLICATIONS

M. Nagatomo et al., "A High Density 4M DRAM Process Using Folded Bitline Adaptive Side-Wall Isolated Capacitor (FASIC) Cell", 1986, IEDM, pp. 144–147.
Lu, "Groove-Trench MIS Capacitor", IBM Technical Disclosure Bulletin, vol. 26, No. 2, Jul. 1983, pp. 489–490.

Primary Examiner—Rolf Hille
Assistant Examiner—Robert P. Limanek
Attorney, Agent, or Firm—Lowe, Price, LeBlanc, Becker & Shur

[57] ABSTRACT

A transistor (4, 5, 7, 11) is formed on a sidewall of a projection (22) which is formed on a major surface of a semiconductor substrate (1), and a capacitor (3, 5, 6) is formed on the surface of the semiconductor substrate (1) around the projection (22), to be connected to the transistor. At the forward end of the projection, an interconnection member (8) is connected to a source/drain region (11) of the transistor. Further, a transistor (4, 5, 7, 11)n is formed on an upper surface portion of a projection (22) which is formed on a major surface of a semiconductor substrate (1), and a capacitor (3, 5, 6) to be connected to the transistor is formed on a sidewall of the projection (22). An isolation oxide film (2) is formed on the major surface of the semiconductor substrate around the projection and under the capacitor. Further, a first projection (62) is formed on a major surface of a semiconductor substrate (1), and a second projection (22), which is smaller than the first projection (62), is formed on the first projection (62). A transistor (4, 5, 7, 11) is formed on a sidewall of the second projection (22) and a capacitor (3, 5, 6) is formed on a sidewall of the second projection (62) respectively, such that the transistor and the capacitor are connected with each other through an impurity layer (5) formed on an upper surface of the first projection (62).

43 Claims, 50 Drawing Sheets

F I G. 12
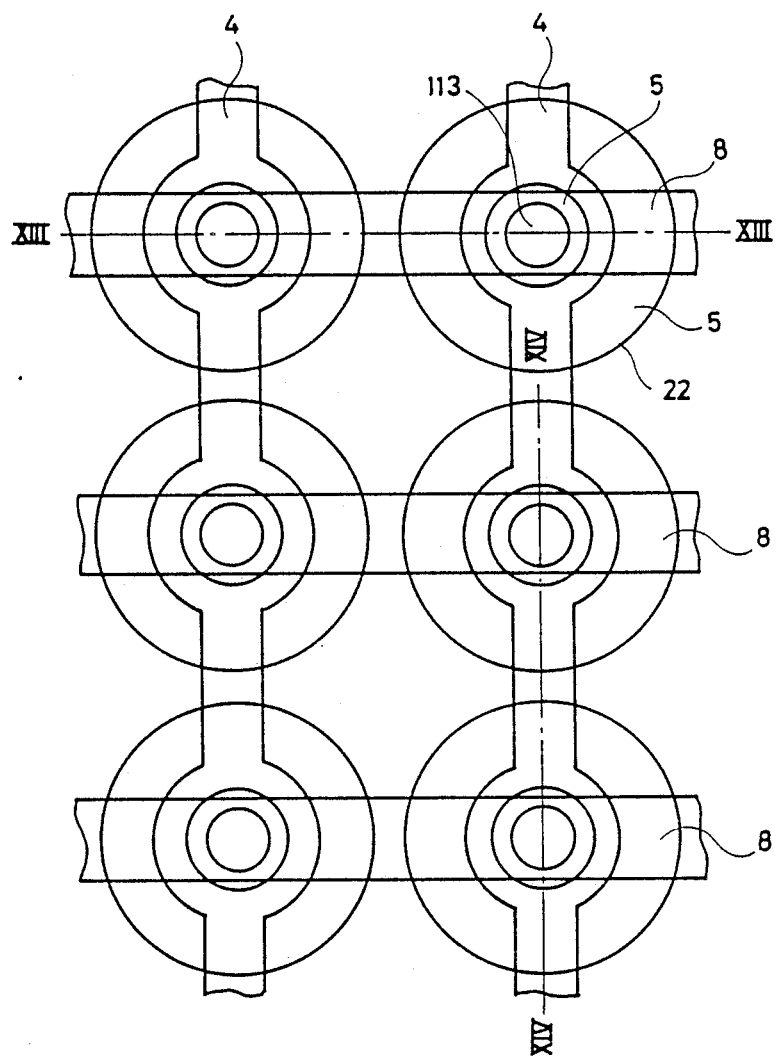

F I G. 23
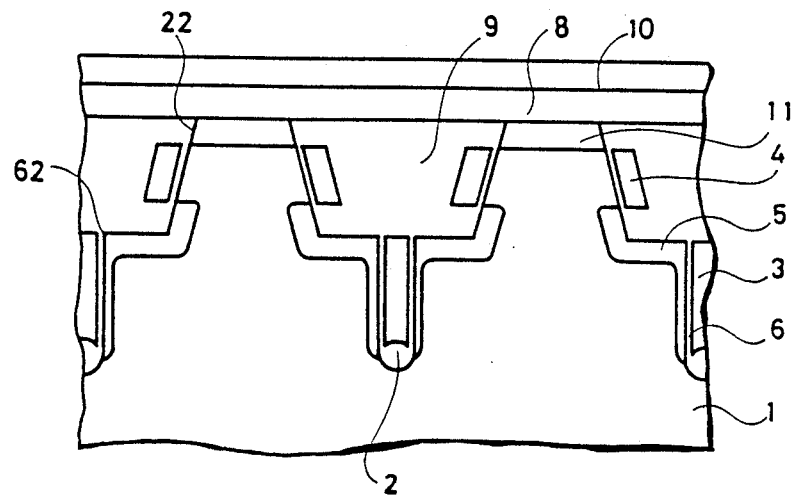
F I G. 24
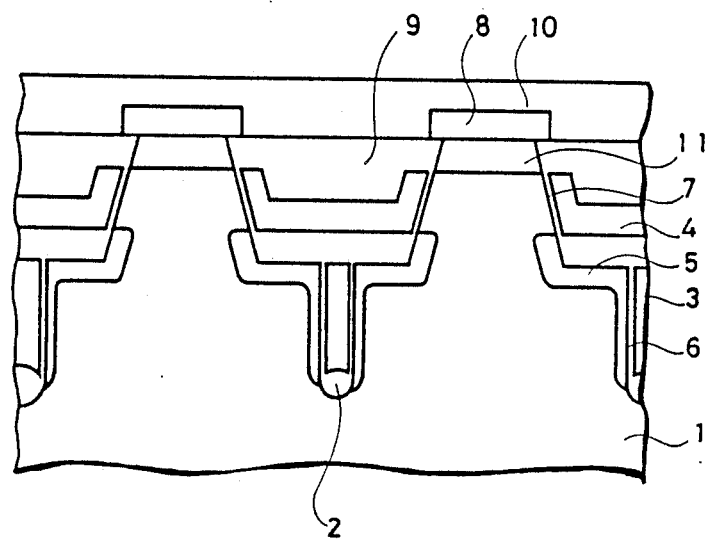

SEMICONDUCTOR MEMORY DEVICE HAVING PROTRUDING CELL CONFIGURATION

BACKGROUND OF THE INVENTION

1. Field of the Invention

The present invention relates generally to a semiconductor memory device, and more particularly, to a semiconductor memory device having a transistor/-capacitor cell formed on a protrusion or island to increase integration density.

2. Description of the Prior Art

FIG. 1 is a block diagram showing exemplary structure of a general RAM. Referring to FIG. 1, a memory cell array 101 is formed by a plurality of word lines and a plurality of bit lines which intersect with each other to be provided with memory cells in respective intersections. A memory cell is selected on the basis of an intersection between a word line selected by an X-address buffer decoder 102 and a bit line selected by a Y-address buffer decoder 103. Indication for writing/reading data in/from the selected memory cell is made by a read/-write control signal R/W which is supplied to an R/W control circuit 104. In data writing, input data $D_{in}$ is inputted in the selected memory cell through the R/W control circuit 104. In data reading, on the other hand, data stored in the selected memory cell is detected by a sense amplifier 105 and thereafter amplified, to be outputted to the exterior through a data output buffer 106 as output data $D_{out}$.

FIG. 2 shows an equivalent circuit diagram of a dynamic type memory cell, for illustrating write/read operation for the memory cell.

Referring to FIG. 2, the dynamic memory cell is formed by a field-effect transistor 108 and a capacitor 109. The gate electrode of the field-effect transistor 108 is connected to a word line 110 and a source/drain electrode, which is connected with the capacitor 109, is connected to a bit line 107 respectively. In data writing, the field-effect transistor 108 conducts by application of a prescribed potential to the word line 110, whereby charges applied to the bit line 107 are stored in the capacitor 109. In data reading, on the other hand, the field-effect transistor 108 conducts by application of a prescribed potential to the word line 110, whereby the charges stored in the capacitor 109 are drawn out through the bit line 107.

FIG. 3 illustrates plane layout of a memory part of a dynamic MOSRAM (random access memory) being in folded bitline structure, and FIG. 4 is a sectional view taken along the line IV—IV in FIG. 4.

The structure of the dynamic MOSRAM is now described with reference to these figures.

The RAM is provided with pairs of MOS transistors and capacitors formed in active regions 112, which are isolated from adjacent elements by isolation oxide films 2 formed on prescribed positions of the major surface of a semiconductor substrate 1. Each MOS transistor is formed by impurity layers 5 and 11 formed on the major surface of the semiconductor substrate 1 to serve as source or drain regions and a word line 4 for serving as a gate electrode formed through a gate dielectric film 7 on a region between the impurity layers 5 and 11. Each capacitor is formed by an impurity layer 5b provided in a region between the impurity layer 5 and the isolation oxide film 2 and a cell plate 3 provided on the impurity layer 5b to also cover the isolation oxide film 2 through a capacitor dielectric film 6. An interlayer isolation film 9 is formed by an oxide film to cover the transistor and the capacitor, and a bit line 8 formed on the interlayer isolation film 9 is connected to the impurity layer 11 through a contact 111 in a contact hole 113 which is provided in the interlayer isolation film 9. Further, the bit line 8 is covered and protected by a surface protective coat 10 which is formed by a nitride film.

In the RAM of such structure, a prescribed potential is applied to a selected word line 4 to allow conduction of the region between the impurity layers 5 and 11 under the same, thereby to perform read/write operation.

In the conventional semiconductor memory device, MOS structural members forming each semiconductor device such as the aforementioned MOS transistor and the capacitor for storing information charges are arranged on the plane of the semiconductor substrate 1. Thus, the area occupied by such members has reached the limit in the current 1-Mb semiconductor memory device of MOS random access type, which is directed to increase in integration density. Thus, it has been very difficult to further increase integration density.

"A High Density 4M DRAM Process Using Folded Bitline Adaptive Side-Wall Isolated Capacitor (FASIC) Cell" by M. Nagatomo et al., 1986 IEDM, pp. 144–147 discloses technique of forming capacitors of respective elements by providing impurity regions in sidewalls of trenches longitudinally formed around element regions.

However, the disclosure in the above described document fails to achieve high integration density and high reliability according to the present invention because a transistor part is formed in a plane part or a method for preventing interference between a capacitor formed on the sidewall of a trench and an adjacent cell is not clearly shown.

SUMMARY OF THE INVENTION

An object of the present invention is to provide a semiconductor memory device which can increase integration density.

Another object of the present invention is to provide a semiconductor memory device which can increase integration density without enlarging the plane area on a semiconductor substrate.

Still another object of the present invention is to provide a semiconductor memory device which surely isolates between adjacent elements.

A further object of the present invention is to provide a semiconductor memory device which eliminates interference of charges stored between adjacent elements.

In order to attain the above described objects, a semiconductor memory device according to the present invention comprises a semiconductor substrate having a major surface and a projection formed on the major surface, which projection has a sidewall and an upper end portion, a transistor formed on the sidewall of the projection, and a capacitor formed on the major surface of the semiconductor substrate to be connected to the transistor.

In another aspect of the present invention, a semiconductor memory device comprises a semiconductor substrate having a major surface and a projection formed on the major surface, which projection has a flat upper surface and a sidewall, a transistor formed on the upper surface of the projection, a capacitor formed on the sidewall of the projection to be connected to the transistor, and an isolation film provided on a region of the major surface of the semiconductor substrate around the projection and under the capacitor.

In a further aspect of the present invention, a semiconductor memory device comprises a semiconductor substrate having a major surface on which a first projection having a flat upper surface is formed with a second projection smaller than the first projection, being formed thereon. Each of the first and second projections has a sidewall. The semiconductor memory device further comprises a transistor formed on the sidewall of the second projection, a capacitor formed on the sidewall of the first projection to be connected to the transistor, and an isolation film formed on a region of the major surface of the semiconductor substrate around the first projection and under the capacitor.

According to an embodiment of the present invention, the transistor is formed on the sidewall of the projection provided on the semiconductor device, whereby its occupied area can be reduced in plane to increase integration density of the semiconductor memory device.

According to another embodiment of the present invention, the capacitor is formed on the sidewall of the projection provided on the semiconductor substrate while the isolation oxide film is formed on the major surface of the semiconductor substrate around the projection to increase integration density, whereby a punch-through phenomenon can be prevented in a capacitor part between each pair of adjacent elements in high reliability.

According to still another embodiment of the present invention, the capacitor is formed on the sidewall of the first projection of the semiconductor substrate and the transistor is formed on the sidewall of the second projection provided on the first projection while the isolation oxide film is formed on the major surface of the semiconductor substrate around the first projection to further increase integration density, whereby a punch-through phenomenon can be prevented in a capacitor part between each pair of adjacent elements in high reliability.

Therefore, the transistor and the capacitor are formed in the form of projections of the semiconductor substrate, so that integration density is increased without increasing the plane area. In addition, the isolation oxide film is suitably arranged, so that the semiconductor memory device is obtained in high reliability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 illustrates plane layout of another embodiment of the present invention;

FIGS. 23 and 24 are cross sectional views showing a further embodiment corresponding to FIGS. 20 and 21, respectively;

DESCRIPTION OF THE PREFERRED EMBODIMENTS

Figure 1:
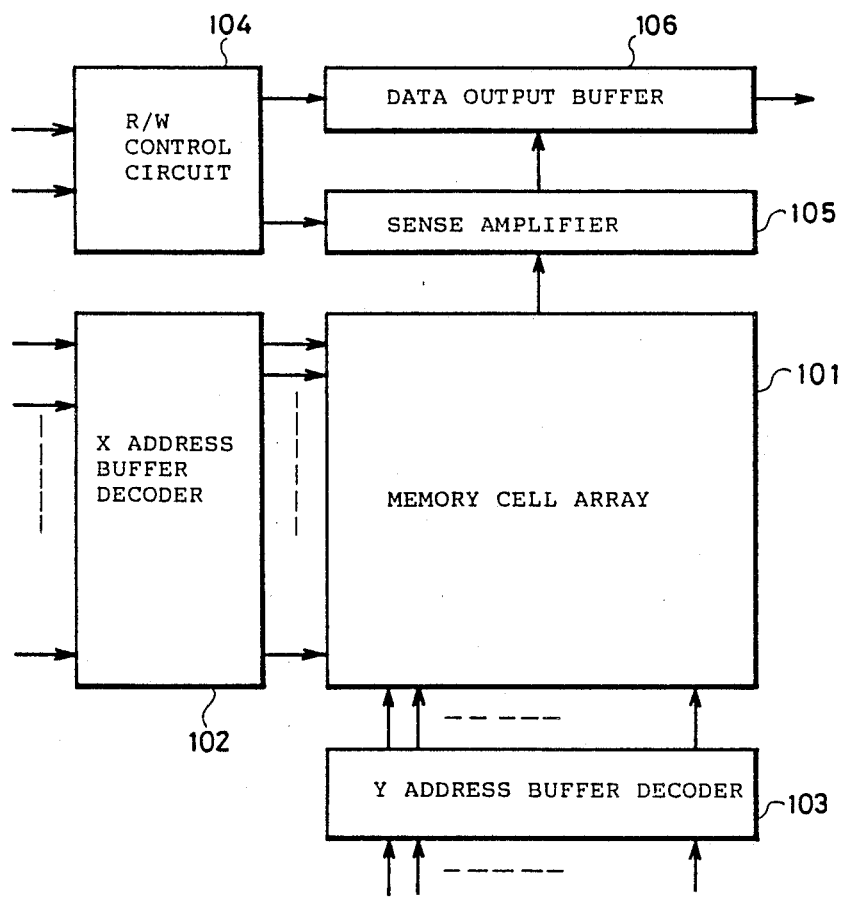
FIG. 1 is a block diagram showing exemplary structure of a general RAM.
Figure 2:
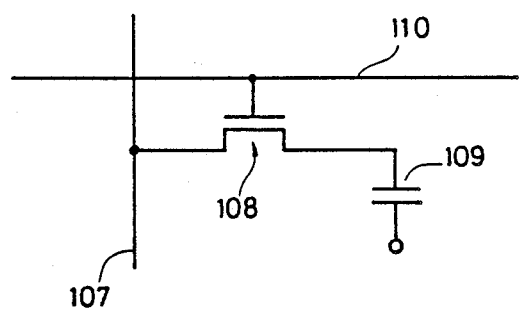
FIG. 2 is an equivalent circuit diagram of a dynamic memory cell.
Figure 3:
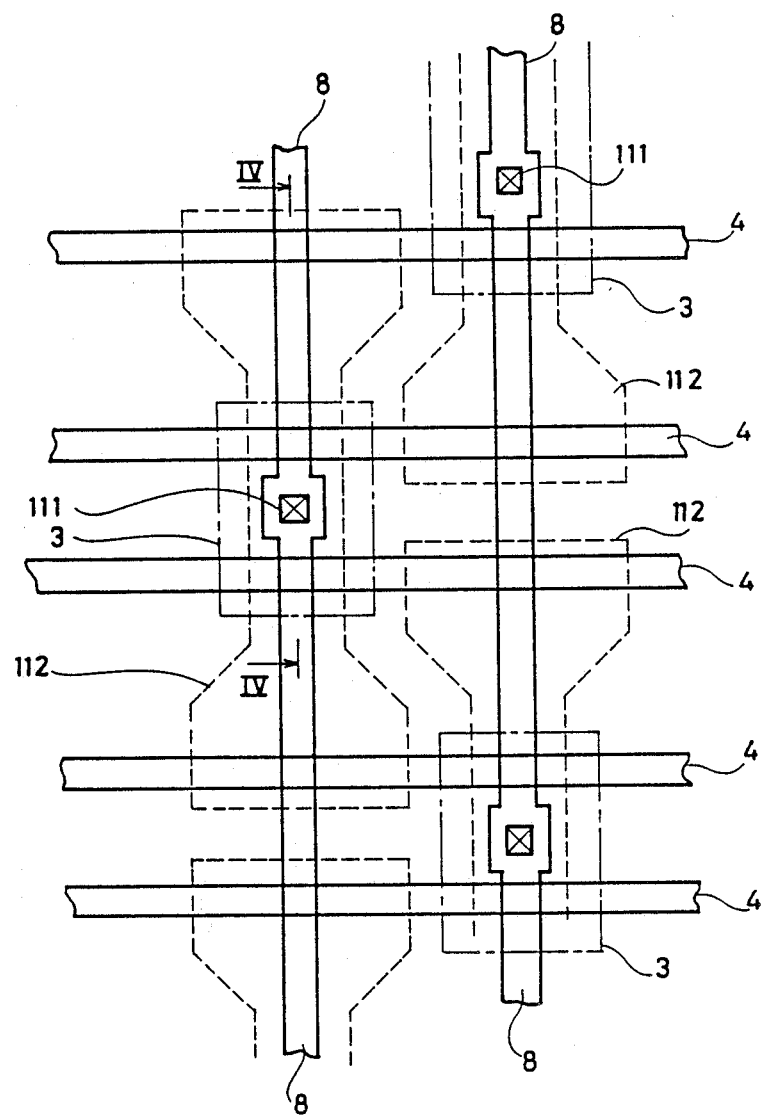
FIG. 3 illustrates plane layout of a memory part of a dynamic MOSRAM of folded bitline structure.
Figure 4:
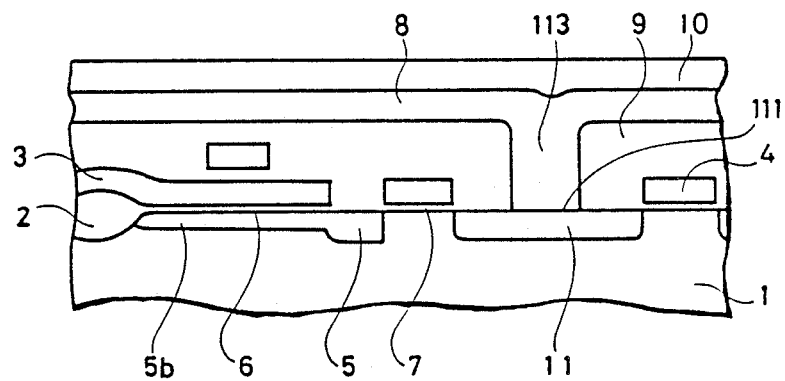
FIG. 4 is a sectional view taken along the line IV—IV in FIG. 3.
Figure 5:
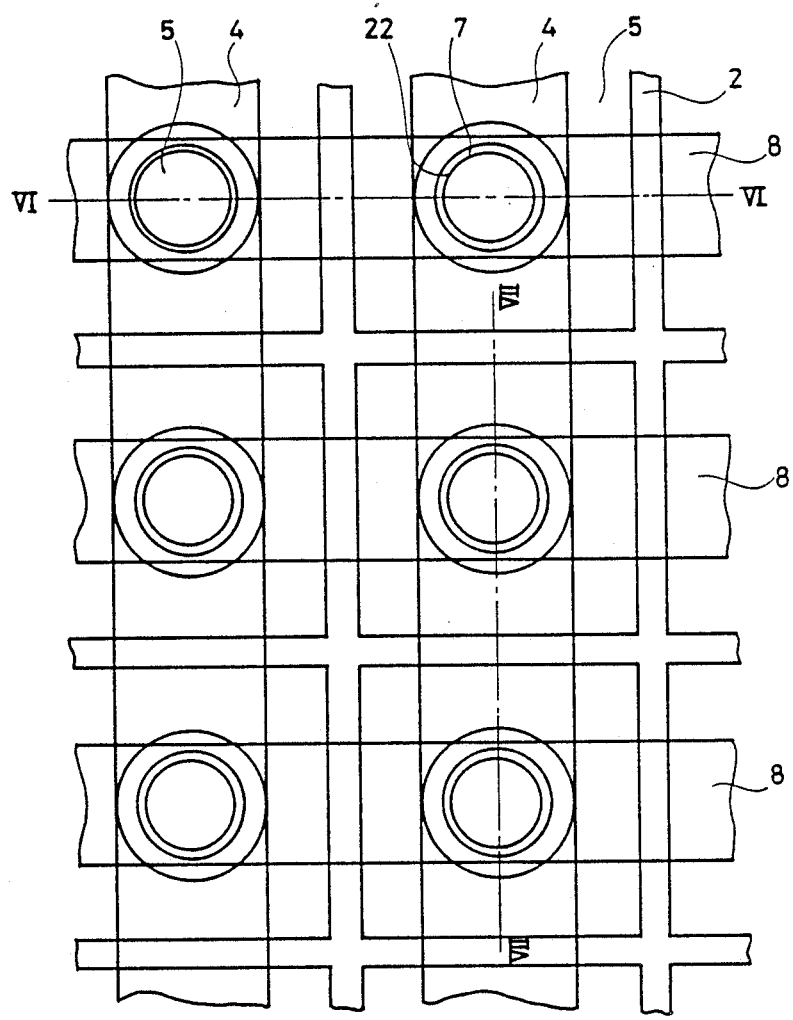
FIG. 5 illustrates plane layout in an embodiment of the present invention.
Figure 6:
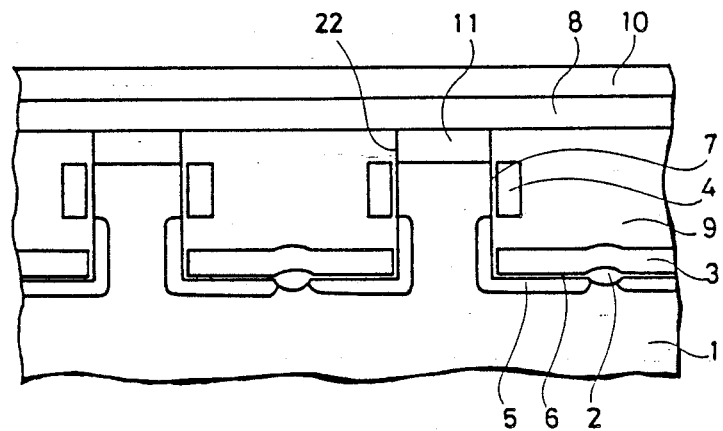
FIG. 6 is a sectional view taken along the line VI—VI in FIG. 5.
Figure 7:
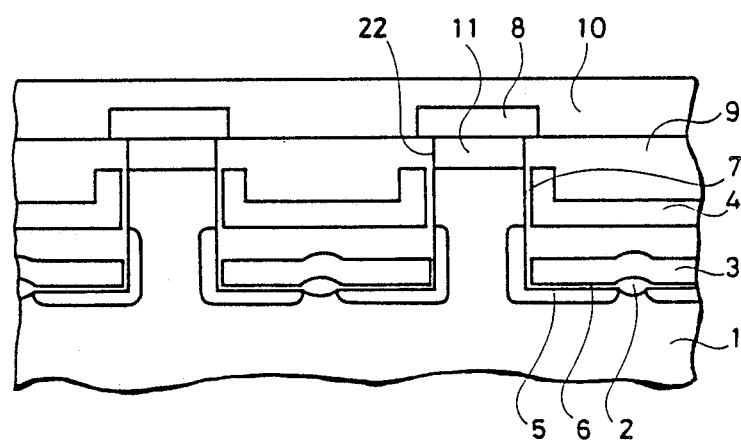
FIG. 7 is a sectional view taken along the line VII—VII in FIG. 5.

FIG. 5 illustrates plane layout of a semiconductor memory device according to an embodiment of the present invention, FIG. 6 is a sectional view taken along the line VI—VI in FIG. 5, and FIG. 7 is a sectional view taken along the line VII—VII in FIG. 5.

With reference to FIGS. 5 to 7, description is now made on the structure of the inventive semiconductor memory device.

Illustrated in FIGS. 5 to 7 is a MOS random access type semiconductor memory device, which is formed by one transistor-one capacitor type memory cells each having a MOS transistor and an information charge storage capacitor serially connected to the same. A semiconductor substrate 1 of silicon is provided on its major surface with island regions of projections 22 having regularly cylindrically protruding surfaces. As shown in FIGS. 6 and 7, each of the memory cells is provided with a MOS. transistor (4, 5, 7, 11) formed on the sidewall surface of each projection 22, a capacitor (3, 5, 6) formed in series therewith on a major surface part of the semiconductor substrate 1 in proximity to the projection 22, a bit line 8 and a word line 4. The upper end portion of the projection 22 is provided with an impurity diffusion layer 11 for serving as a source or drain region of the MOS transistor, while the word line 4, also serving as a gate electrode of the MOS transistor, is provided in the form of a ring along the sidewall surface of the projection 22 through a gate dielectric film 7. A cell plate 3 for serving as one of capacitor electrodes is formed on the major surface of the semiconductor substrate 1, while isolation oxide films 2 for isolating the elements on such regions on the major surface are arranged in a grating manner as shown in FIG. 5. The word line 4, also serving as the gate electrode of each MOS transistor, is formed by interconnecting respective gate electrodes of the MOS transistors of the memory cells arranged in intersection with the bit line 8. As shown in FIGS. 6 and 7, the bit line 8 is directly in contact with the plane of the cylindrical end portion of the impurity diffusion layer 11 serving as a source or drain region of each MOS transistor, through no contact hole. Namely, the MOS transistors substantially occupy no area on the plane as shown in FIG. 5, thereby to contribute to high integration density.

Figure 8A:
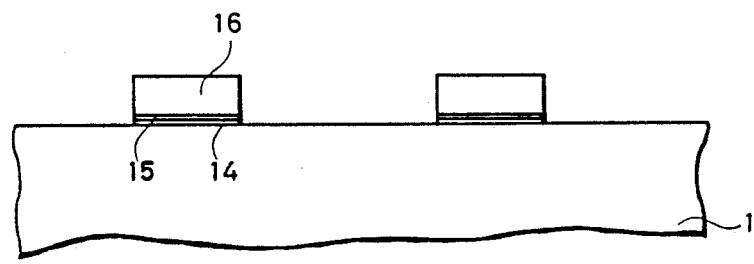
FIGS. 8A to 8N are sectional views showing steps of a method of manufacturing the embodiment of the present invention.
Figure 8B:
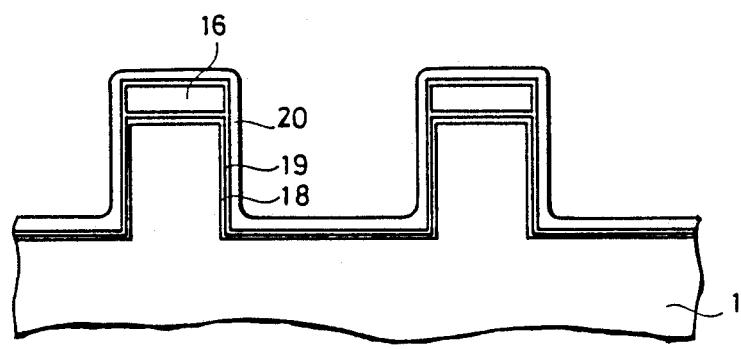
Figure 8C:
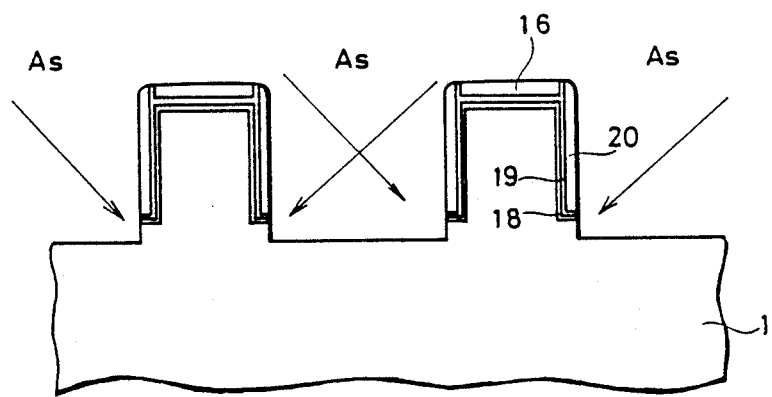
Figure 8D:
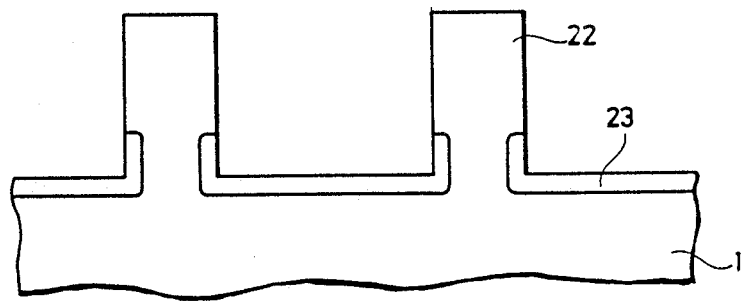
Figure 8E:
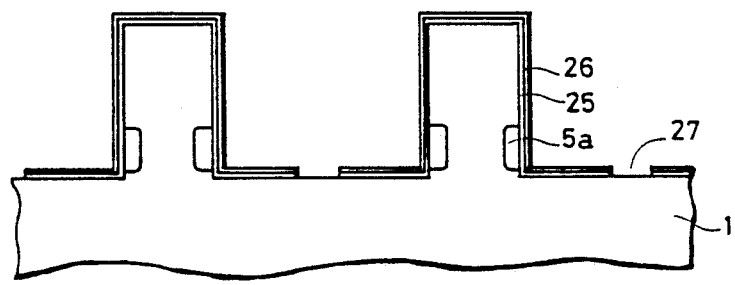
Figure 8F:
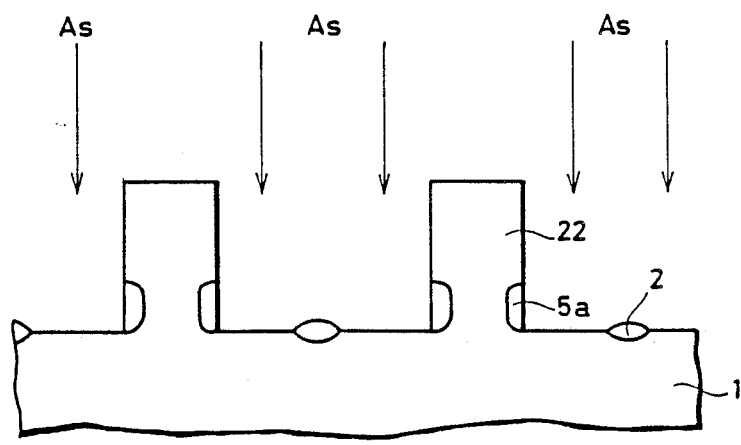
Figure 8G:
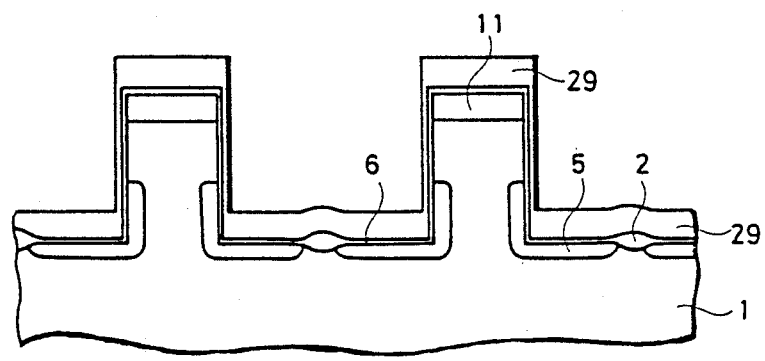
Figure 8H:
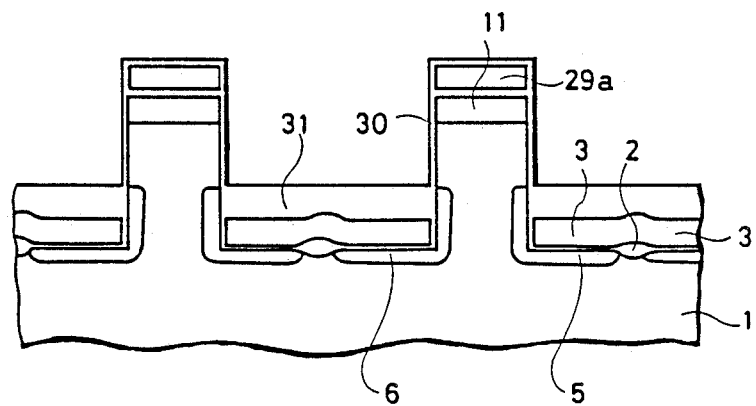
Figure 8I:
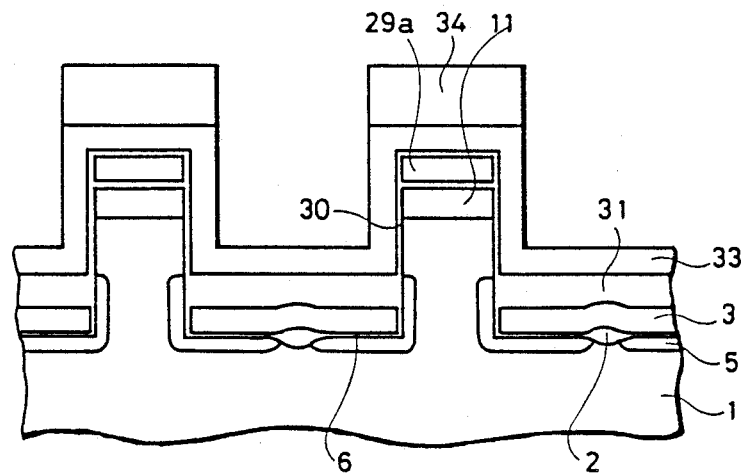
Figure 8J:
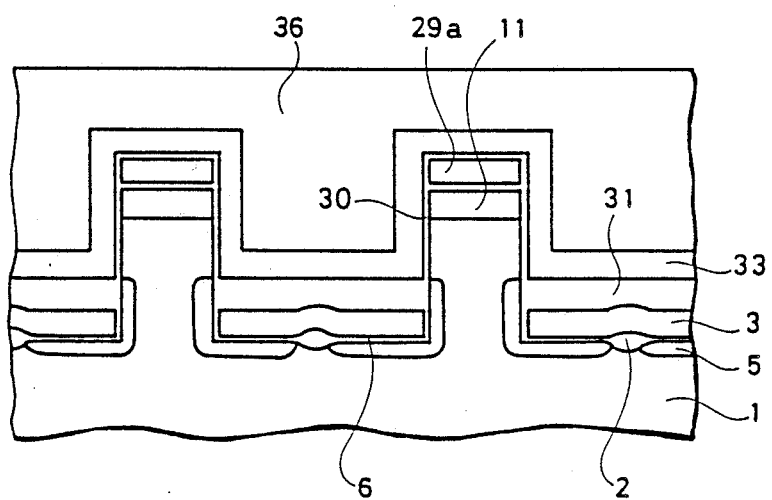
Figure 8K:
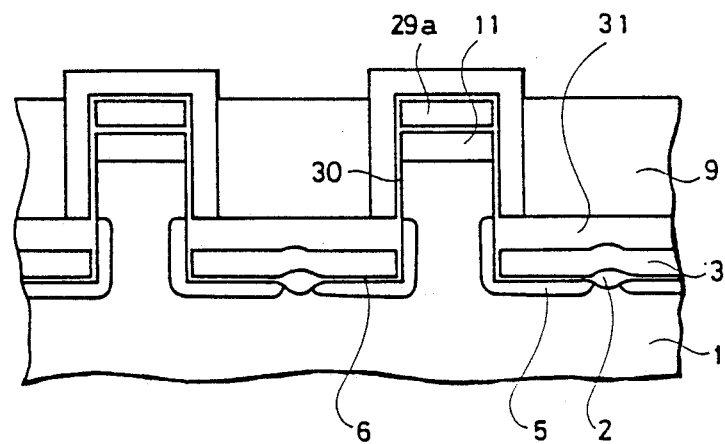
Figure 8L:
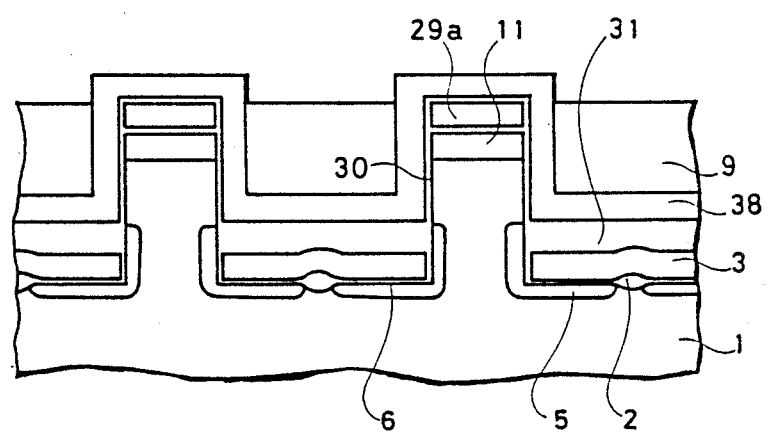
Figure 8M:
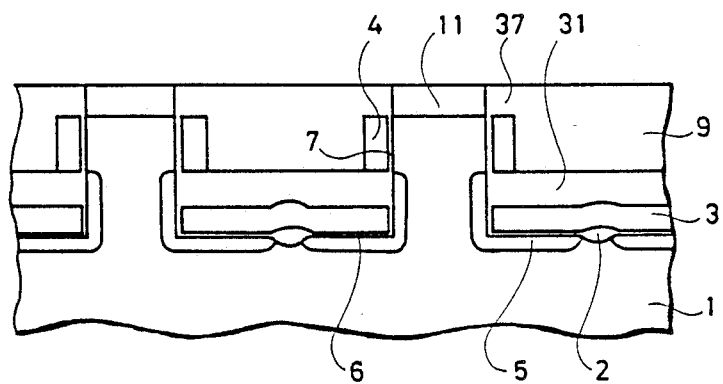
Figure 8N:
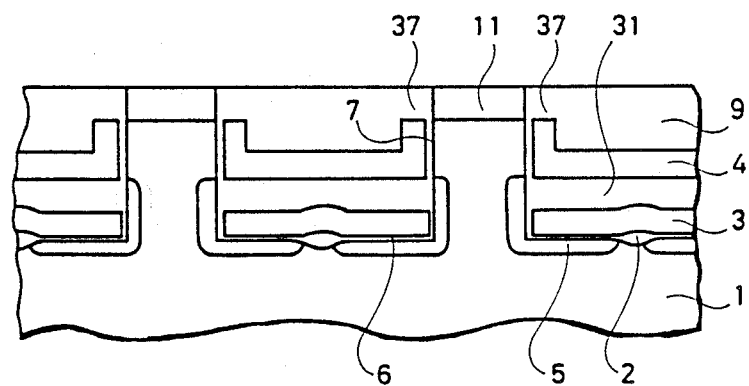

FIGS. 8A to 8N are sectional views showing steps of a method of manufacturing the embodiment as shown in FIGS. 5 to 7.

Description is now made on this manufacturing method with reference to FIGS. 8A to 8N.

First, a semiconductor substrate 1 is prepared by a P-type monocrystal silicon substrate, and a thin silicon oxide film 14 is grown on the surface thereof by thermal oxidation. A silicon nitride film 15 is formed thereon by CVD chemical vapor deposition), and: a thick silicon oxide film 16 is further formed thereon also by CVD. Then, the silicon oxide films 14 and 16 and the silicon nitride film 15 are partially removed through a -photoengraving process from regions of the semiconductor substrate 1 to be formed with no projection (FIG. 8A).

Each silicon oxide film 16 thus left through patterning serves as a processing etching mask for forming a region provided with a protruding island region on the P-type monocrystal silicon substrate 1. Then, the silicon oxide film 16 is utilized as such a mask to perform RIE (reactive ion etching) on the P-type monocrystal silicon substrate 1, to define a trench. Then, the region of the P-type monocrystal silicon substrate 1 whose major surface is exposed to define the trench is thermally oxidized to grow a thin silicon oxide film 18, and thereafter a silicon nitride film 19 is formed over the entire surface by CVD, while a thick silicon oxide film 20 is further formed on the same also by CVD (FIG. 8B).

RIE is performed from above to remove the oxide films 20 and 18 and the nitride film 19, so that only a part of the silicon oxide film 20 provided on the sidewall surface of the trench is not etched but left in the form of a film since such a part has large vertical thickness. Then As is implanted into parts of the P-type monocrystal silicon substrate 1 exposed on the bottom surface and the lower part of the sidewall surface of the trench by oblique ion implantation (FIG. 8C).

The semiconductor substrate 1, being formed with an impurity diffusion layer 23 for serving as a source or drain region by such implantation of As, is subjected to isotropic plasma etching through Freon gas so that the bottom surface of the trench and the sidewall portion thereof, being close to the bottom surface, are transversely etched. Such etching is so controlled that the silicon substrate surface on the sidewall of the trench in the region provided with the residual silicon oxide film 20 is aligned with the silicon substrate surface on a sidewall portion close to the bottom surface of the trench transversely spread by the aforementioned plasma etching. Then wet chemical etching is performed to remove the silicon oxide film 20, and the silicon substrate 1 exposed on the lower surface part of the trench is thermally oxidized to grow a thin silicon oxide film (not shown). Thereafter plasma etching is performed by Freon gas to remove the residual silicon nitride film 19, and wet chemical etching is further performed to remove the silicon oxide film 18 left over the entire surface (FIG. 8D).

Then, RIE is performed from above to remove the surface part of the silicon substrate 1 formed with a part of the impurity diffusion layer 23 in the bottom surface of the trench while leaving only the sidewall portion of the trench as an impurity layer 5a. A thin silicon oxide layer 25 is formed by thermal oxidation and a silicon nitride film 26 is further formed thereon by CVD. Then, the silicon nitride film 26 and the silicon film 25 are partially removed from a region to be formed with an isolation oxide film through a photoengraving process (FIG. 8E).

Then a thick isolation oxide film 2 is formed by thermal oxidation to serve as an interlayer isolation film. Then the silicon nitride film 26 and the silicon oxide film 25, serving as oxidation masks, are entirely removed and As is perpendicularly ion-implanted into the bottom surface of the trench and the upper surface of the projection 22 at an angle of 0° (FIG. 8F).

The semiconductor substrate 1, being provided with an impurity layer 5 in the bottom surface of the trench with the residual impurity layer 5a and another impurity layer 11 on the upper part of the projection 22 by implantation of As, is thermally oxidized to form an oxide film 6, serving as a capacitor dielectric film, entirely over the bottom surface of the trench. Thereafter a conductive polysilicon film 29 for serving as a capacitor plate electrode is formed entirely over the bottom surface of the trench by sputter deposition. The polysilicon film 29 thus formed by sputtering is extremely small in thickness in a portion on the sidewall of the trench FIG. 8G).

Then thermal oxidation is performed on the surface of the polysilicon film 29 to entirely convert the thin polysilicon part on the sidewall of the trench into a silicon oxide film, and wet chemical etching is performed to remove the silicon oxide film. Then a polysilicon film 3 for serving as a capacitor plate electrode is formed on the bottom surface of the trench to be filled up with a silicon oxide film 31 through SOG (spin on glass), and a silicon oxide film 30 for serving as a gate dielectric film is formed by thermal oxidation (FIG. 8H).

The following description is made with reference to sections taken along the lines VI—VI and VII—VII in FIG. 5.

In the state as shown in FIG. 8H, a conductive polysilicon film 33 for serving as the word line 4 is deposited on the surface of the substance by CVD. Then the polysilicon film 33 is patterned by a multilayer resist process. FIGS. 8I and 8J are sectional views taken along the lines VI—VI and VII—VII respectively, in which a lower resist layer 36 is patterned. Then the polysilicon film 33 is etched by RIE. Then, after removing lower resist layer 36, a silicon oxide film for serving as the interlayer isolation film 9 is deposited by CVD to fill up the trench, and then the silicon oxide film is etched to be flush with the polysilicon film 29a provided on the upper end portion of the projection 22 by an etchback process. FIGS. 8K and 8L are sectional views taken along the lines VI—VI and VII—VII respectively, for showing such a state.

Then plasma etching is performed by Freon gas to etch the polysilicon film 33 exposed on the surface and thereafter the silicon oxide film 30 is removed, followed by removal of the polysilicon film 29a formed by sputtering. Then wet chemical etching is performed to etch the silicon oxide film 9 filling up the trench by CVD to be flush with the silicon substrate surface of the projection 22. FIGS. 8M and 8N are sectional views taken along the lines VI—VI and VII—VII, in which a concave portion in the trench region is filled up with a silicon oxide film 37 through SOG.

Finally, an aluminum film formed on the oxide film 37 is patterned to form the bit line 8, and the entire surface is covered by a surface protective coat 10 prepared by a silicon nitride film, thereby to complete the semiconductor memory device as shown in FIGS. 6 and 7, which are sectional views taken along the lines VI—VI and VII—VII of FIG. 5 respectively.

Figure 9:
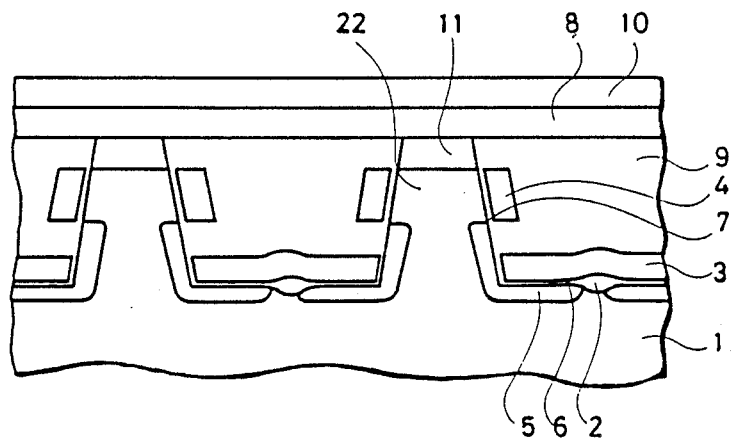
FIGS. 9 and 10 are sectional views showing another embodiment of the present invention.
Figure 10:
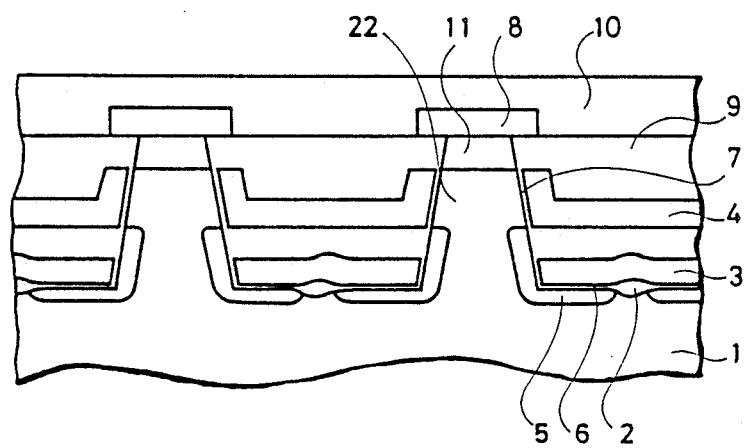

FIGS. 9 and 10 are sectional views showing another embodiment of the present invention in correspondence to FIGS. 6 and 7.

This embodiment is identical in structure to the aforementioned embodiment, except for that projections protruding from the major surface of a semiconductor substrate are provided in the form of truncated cones. Namely, a transistor is formed on the sidewall of each truncated-conical projection, and a capacitor to be connected to the transistor is formed on the major surface of the semiconductor substrate. Thus, the sidewall of the projection is so slanted in this embodiment as to increase integration density as compared with that of the prior art.

Figure 11A:
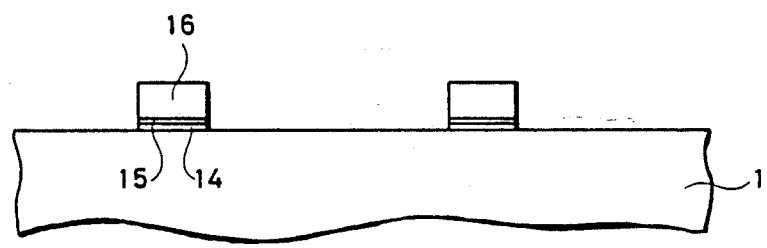
FIGS. 11A to 11N are cross sectional views showing steps of a method of manufacturing another embodiment of the present invention shown in FIGS. 9 and 10.
Figure 11B:
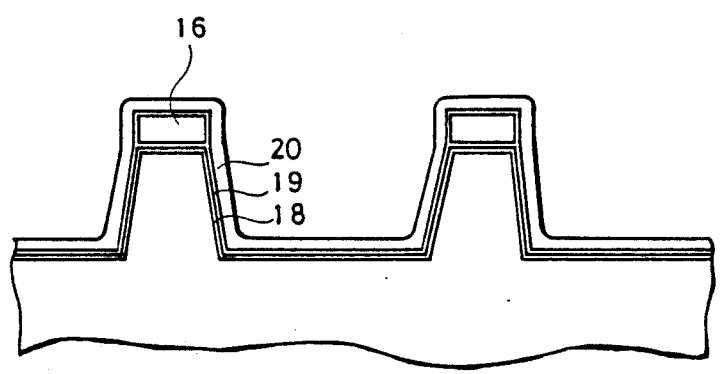
Figure 11C:
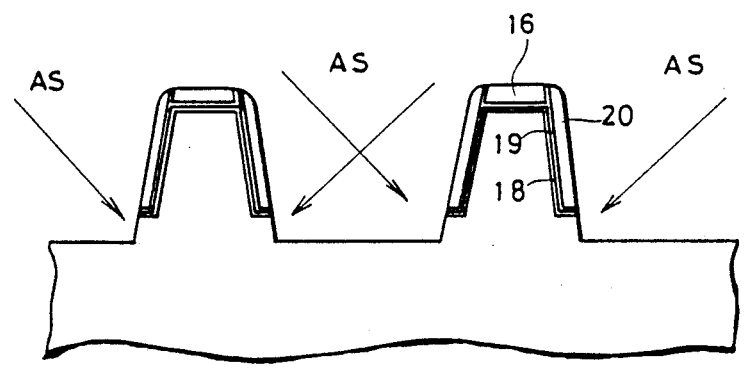
Figure 11D:
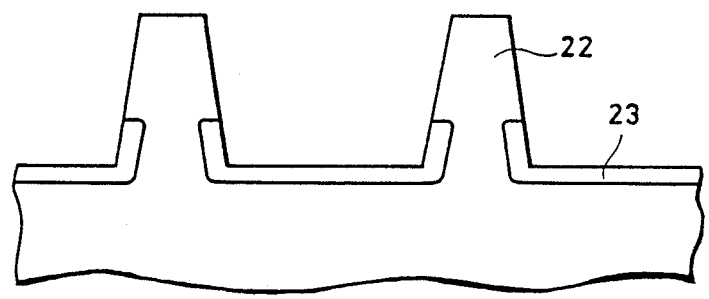
Figure 11E:
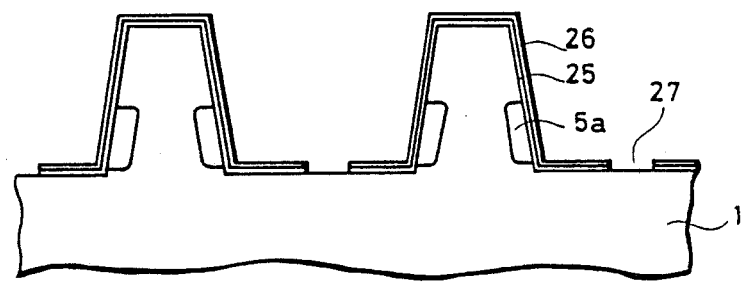
Figure 11F:
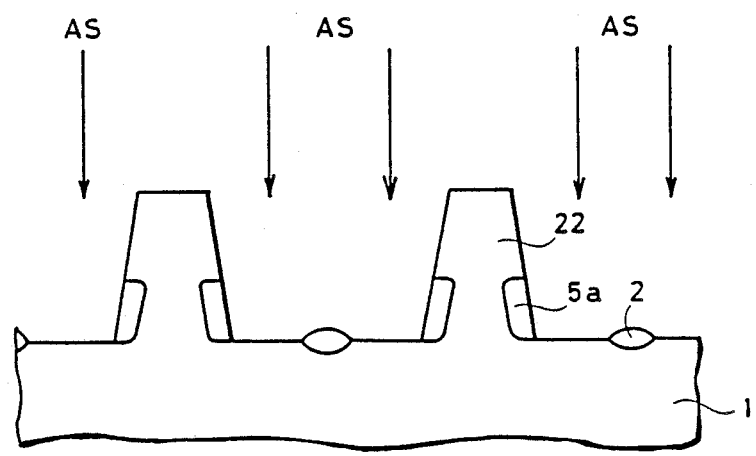
Figure 11G:
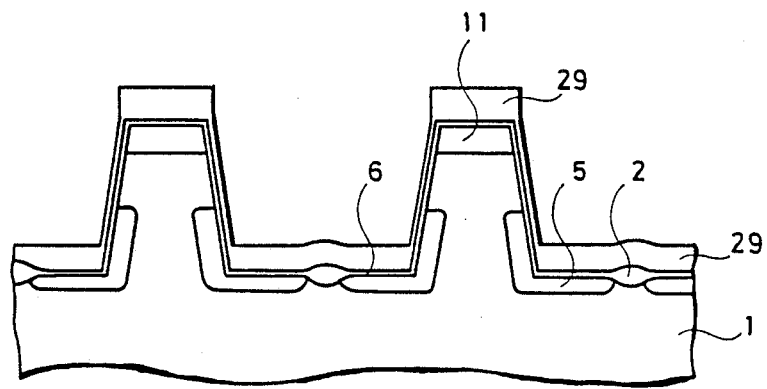
Figure 11H:
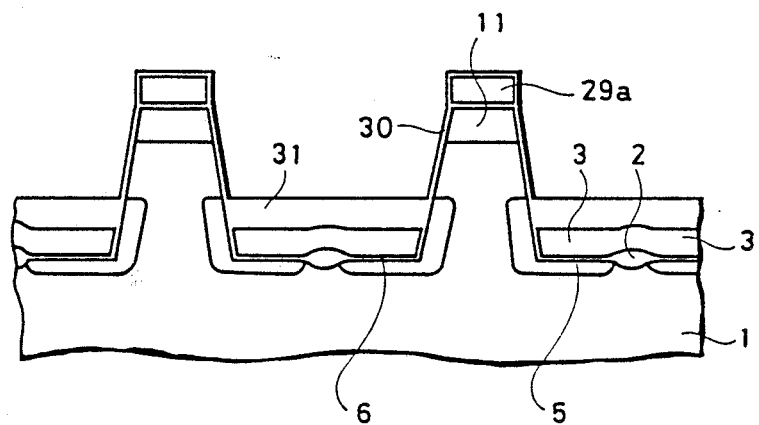
Figure 11I:
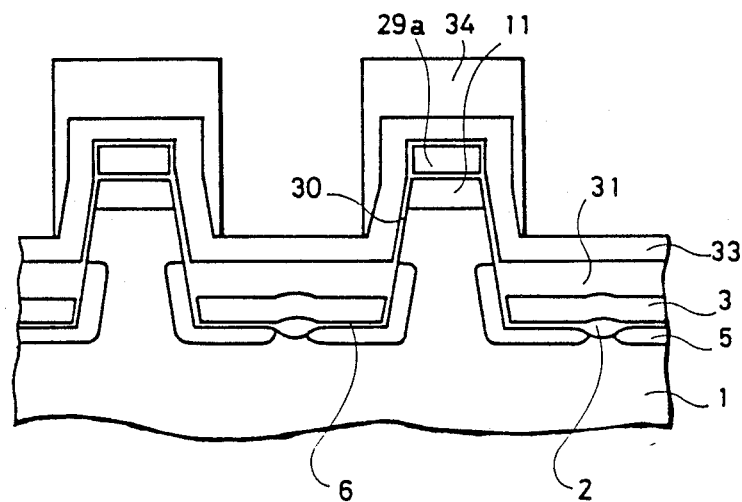
Figure 11J:
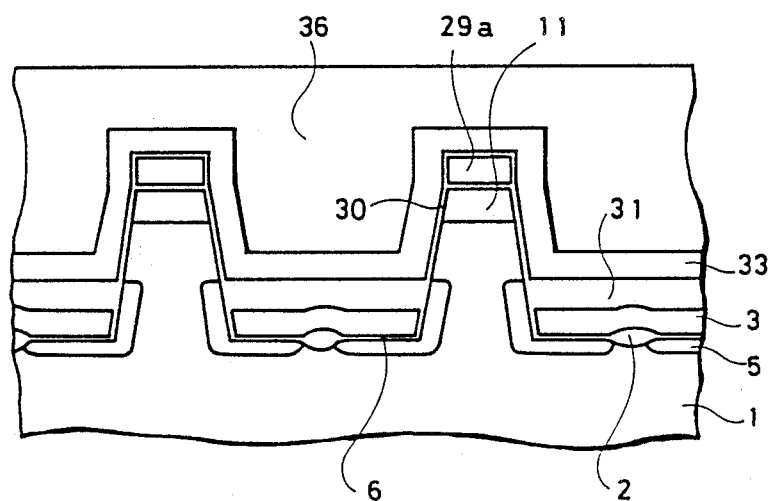
Figure 11K:
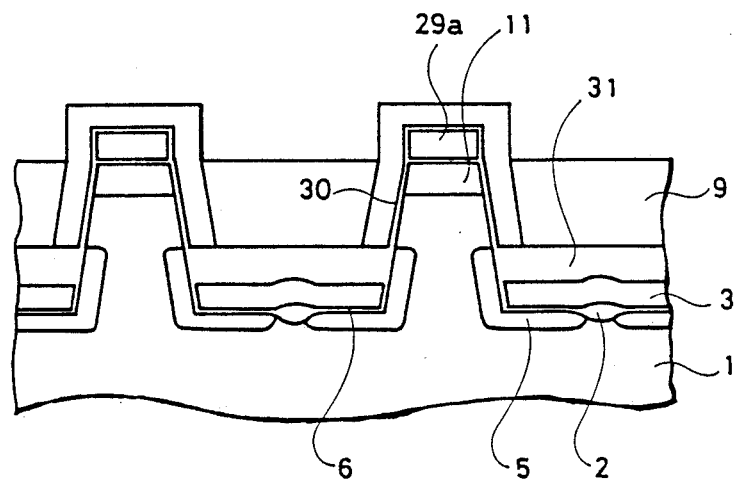
Figure 11L:
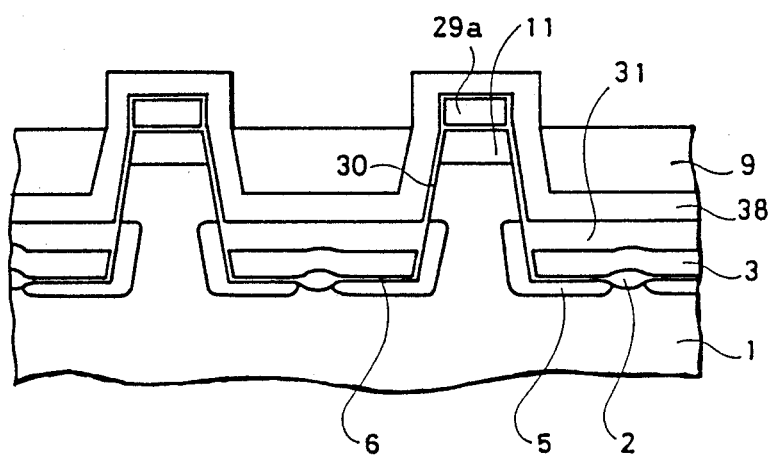
Figure 11M:
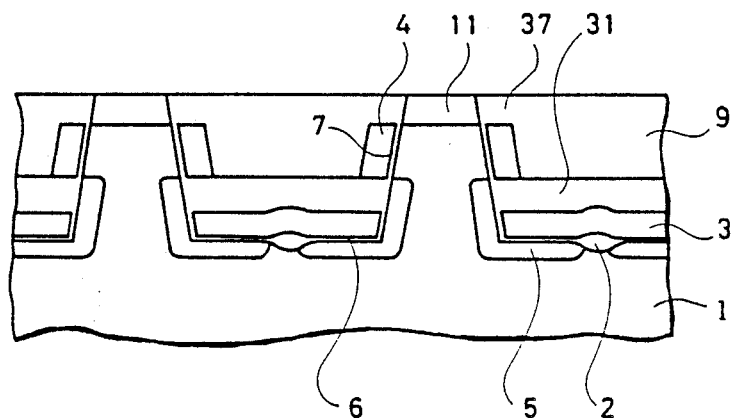
Figure 11N:
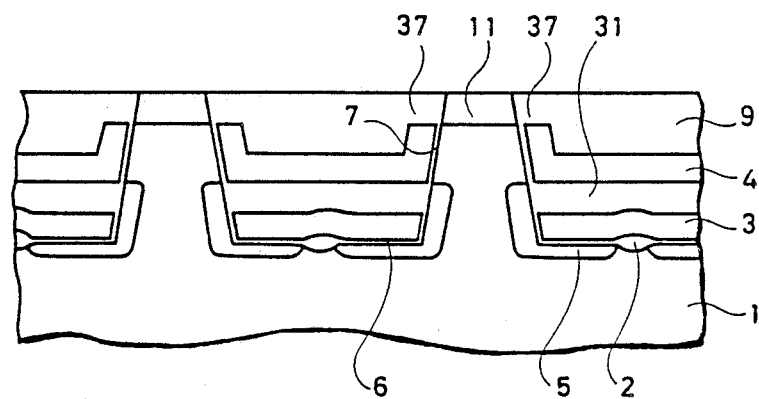

FIGS. 11A to 11N are sectional views: showing steps of a method of manufacturing the embodiment as shown in FIGS. to 10.

Description is now made on this manufacturing method with reference to FIGS. 11A to 11N.

First, a semiconductor substrate 1 is prepared by a P-type monocrystal silicon substrate, and a thin silicon oxide film 14 is grown on the surface thereof by thermal oxidation. A silicon nitride film 15 is formed thereon by CVD (chemical vapor deposition), and a thick silicon oxide film 16 is further formed thereon also by CVD. Then, the silicon oxide films 14 and 16 and the silicon nitride film 15 are partially removed through a photoengraving process from regions of the semiconductor substrate 1 to be formed with no projection (FIG. 11A).

Each silicon oxide film 16 thus left through patterning serves as a processing etching mask for forming a region provided with a protruding island region on the P-type monocrystal silicon substrate 1. Then, the silicon oxide film 16 is utilized as such a mask to perform RIE (reactive ion etching) on the P-type monocrystal silicon substrate 1, to define a trench having tapered sidewalls. Then, the region of the P-type monocrystal silicon substrate 1 whose major surface is exposed to define the trench is thermally oxidized to grow a thin silicon oxide film 18, and thereafter a silicon nitride film 19 is formed over the entire surface by CVD, while a thick silicon oxide film 20 is further formed on the same also by CVD (FIG. 11B).

RIE is performed from above to remove the oxide films 20 and 18 and the nitride film 19, so that only a part of the silicon oxide film 20 provided on the sidewall surface of the trench is not etched but left in the form of a film since such a part has large vertical thickness. Then As is implanted into parts of the P-type monocrystal silicon substrate 1 exposed on the bottom surface and the lower part of the sidewall surface of the trench by oblique ion implantation (FIG. 11C).

The semiconductor substrate 1, being formed with an impurity diffusion layer 23 for serving as a source or drain region by such implantation of As, is subjected to isotropic plasma etching through Freon gas so that the bottom surface of the trench and the sidewall portion thereof, being close to the bottom surface, are transversely etched. Such etching is so controlled that the silicon substrate surface on the sidewall of the trench in the region provided with the residual silicon oxide film 20 is aligned with the silicon substrate surface on a sidewall portion close to the bottom surface of the trench transversely spread by the, aforementioned plasma etching. Then wet chemical etching is performed to remove the silicon oxide film 20, and the silicon substrate 1 exposed on the lower surface part of the trench is thermally oxidized to grow a thin silicon oxide film (not shown). Thereafter plasma etching is performed by Freon gas to remove the residual silicon nitride film 19, and wet chemical etching is further performed to remove the silicon oxide film 18 left over the entire surface (FIG. 11D).

Then, RIE is performed from above to remove the surface part of the silicon substrate 1 formed with a part of the impurity diffusion layer 23 in the bottom surface of the trench while leaving only the sidewall portion of the trench as an impurity layer 5a. A thin silicon oxide layer 25 is formed by thermal oxidation and a silicon nitride film 26 is further formed thereon by CVD. Then, the silicon nitride film 26 and the silicon film 25 are partially removed from a region to be formed with an isolation oxide film through a .photoengraving process (FIG. 11E).

Then a thick isolation oxide film 2 is formed by thermal oxidation to serve as an interlayer isolation film. Then the silicon nitride film 26 and the silicon oxide film 25, serving as oxidation masks, are entirely removed and As is perpendicularly ion-implanted into the bottom surface of the trench and the upper surface of the projection 22 at an angle of 0° (FIG. 11F).

The semiconductor substrate 1, being provided with an impurity layer 5 in the bottom surface of the trench with the residual impurity layer 5a and another impurity layer 11 on the upper part of the projection 22 by implantation of As, is thermally oxidized to form an oxide film 6, serving as a capacitor dielectric film, entirely over the bottom surface of the trench. Thereafter a conductive polysilicon film 29 for serving as a capacitor plate electrode is formed entirely over the bottom surface of the trench by sputter deposition. The polysilicon film 29 thus formed by sputtering is extremely small in thickness in a portion on the sidewall of the trench (FIG. 11G).

Then thermal oxidation is performed on the surface of the polysilicon film 29 to entirely convert the thin polysilicon part on the sidewall of the trench into a silicon oxide film, and wet chemical etching is performed to remove the silicon oxide film Then a polysilicon film 3 for serving as a capacitor plate electrode is formed on the bottom surface of the trench to be filled up with a silicon oxide film 31 through SOG (spin on glass), and a silicon oxide film 30 for serving as a gate dielectric film is formed by thermal oxidation (FIG. 11H).

The following description is made with reference to sections taken along the lines VI—VI and VII—VII in FIG. 5.

In the state as shown in FIG. 11H, a conductive polysilicon film 33 for serving as the word line 4 is deposited on the surface of the substance by CVD. Then the polysilicon film 33 is patterned by a multilayer resist process. FIGS. 11I and 11J are sectional views taken along the lines VI—VI and VII—VII respectively, in which a lower resist layer 36 is patterned. Then the polysilicon film 33 is etched by RIE. Then, after removing lower resist layer. 36, a silicon oxide film for serving as the interlayer isolation film 9 is deposited by CVD to fill up the trench, and then, the silicon oxide, film is etched to be flush with the polysilicon film 29a provided on the upper end portion of the projection 22 by an etchback process FIGS. 11K and 11L are sectional views taken along the lines VI—VI and VII—VII respectively, for showing such a state.

Then plasma etching is performed by Freon gas to etch the polysilicon film 33 exposed on the surface and thereafter the silicon oxide film 30 is removed, followed by removal of the polysilicon film 29a formed by sputtering. Then wet chemical etching is performed to etch the silicon oxide film 9 filling up the trench by CVD to be flush with the silicon substrate surface of the projection 22. FIGS. 11M and 11N are sectional views taken along the lines VI—VI and VII—VII, in which a concave portion in the trench region is filled up with a silicon oxide film 37 through SOG.

Finally, an aluminum film formed on the oxide film 37 is patterned to form the bit line 8, and the entire surface is covered by a surface protective coat 10 prepared by a silicon nitride film, thereby to complete the semiconductor memory device as shown in FIGS. 6 and 7, which are sectional views taken along the lines VI—VI and VII—VII of FIG. 5 respectively.

Although the projections are cylindrically and truncated-conically formed in the aforementioned embodiments, the same may be provided in another form of protrusions such as prisms, truncated pyramids or elliptic cylinders, for example. More specifically, if the projections shown in FIGS. 6 and 7 are provided in the form of prisms, the cross sectional shapes are the same as those shown in FIGS. 6 and 7, to obtain the same effect. In addition, the projections shown in FIGS. 9 and 10 are provided in the form of truncated pyramids, the cross sectional shapes are the same as those shown in FIGS. 9 and 10, to obtain a similar effect.

Further, although each embodiment is provided with a ring-shaped gate electrode, the gate electrode is not necessarily continuous as a ring so far as the same is provided around the projection. In this case, it is necessary that the region, which is removed the region on the projection under non continuous gate electrode from the region on the projection under ring-shaped gate electrode, should be the region for separating source and drain region.

Figure 13:
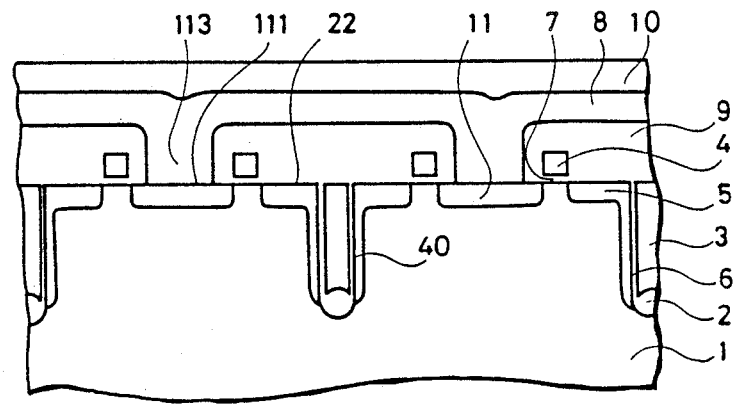
FIG. 13 is a sectional view taken along the line XIII—XIII in FIG. 12.
Figure 14:
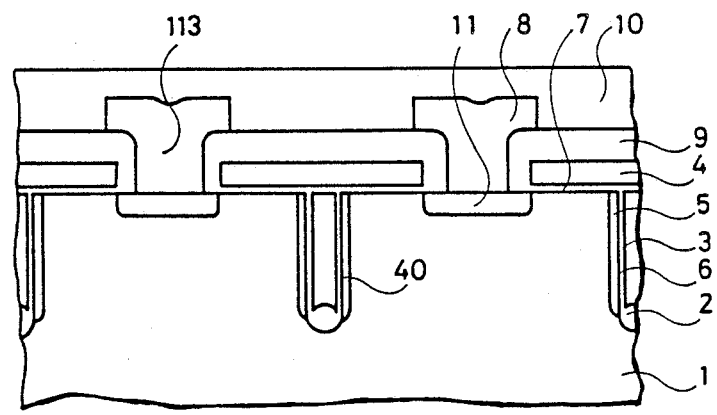
FIG. 14 is a sectional view taken along the line XIV—XIV in FIG. 12.

FIG. 12 illustrates plane layout of another embodiment of the present invention, FIG. 13 is a sectional view taken along the line XIII—XIII in FIG. 12 and FIG. 14 is a sectional view taken along the line XIV—XIV in FIG. 12.

With reference to FIGS. 12 to 14, description is now made on the structure of this embodiment.

A semiconductor substrate 2 of silicon is provided on its major surface with island regions formed by projections 22 having regularly cylindrically protruding surfaces. In each memory cell as shown in FIGS. 13 and 13, a cell plate 3 forming a capacitor (3, 5, 6) for storing information charges is provided in the form of a ring on the sidewall portion of each projection 22 through a capacitor dielectric film 6 to be embedded in a trench between each pair of adjacent cylinders. An isolation oxide film 2 for isolating the elements is provided in a bottom surface region between every pair of adjacent projections 22. In an upper central portion of each projection 22, a contact hole 113 for a bit line 8 is provided in an interlayer isolation film 9 covering the projection 22, while a word line 4 also serving as a gate electrode of a MOS transistor (4, 5, 7, 11) is provided in the form of a ring enclosing the contact hole 113. A channel portion of such a ring-shaped gate electrode is provided on the upper surface of the projection 22, which is not in contact with the region of the isolation oxide film 2. The word line 4 is formed by interconnecting gate electrodes of MOS transistors of memory cells arrayed in intersection with the bit line 8. In this structure, therefore, the cell plate 3, serving as the capacitor for storing information charges, is provided on the sidewall of the projection 22, i.e., on the region of the isolation oxide film 2, to contribute to high integration density.

FIGS. 15A to 15L are sectional views showing steps of a method of manufacturing the embodiment as shown in FIGS. 12 to 14.

The manufacturing method is now described with reference to FIGS. 15A to 15L.

Figure 15A:
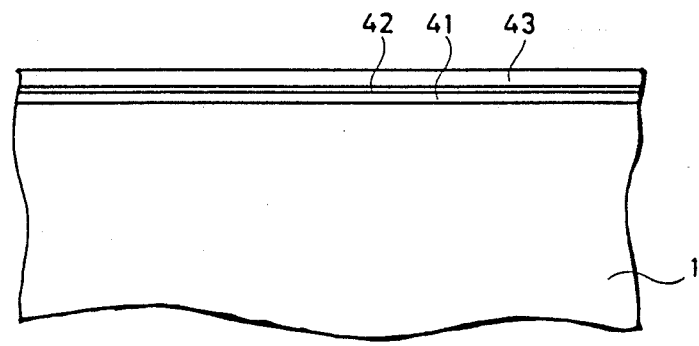
FIGS. 15A to 15L are sectional views showing steps of a method of manufacturing the embodiment shown in FIG. 12.

First, a semiconductor substrate 1 is prepared by a P-type monocrystal silicon substrate, to grow a thin silicon oxide film 41 on its surface by thermal oxidation. A silicon nitride film 42 is formed thereon by CVD, and a thick silicon oxide film 43 is further formed on the same similarly by CVD (FIG. 15A).

Figure 15B:
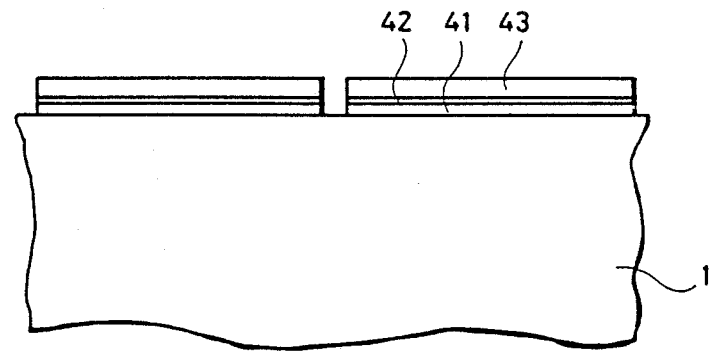

The silicon oxide films 41 and 43 and the silicon nitride film 42 are selectively removed by a photoengraving process from a region for defining a trench in a later step (FIG. 15B).

The silicon oxide film 43 left through patterning serves as a processing etching mask for providing an island-shaped protruding configuration on the P-type monocrystal silicon substrate 1.

Figure 15C:
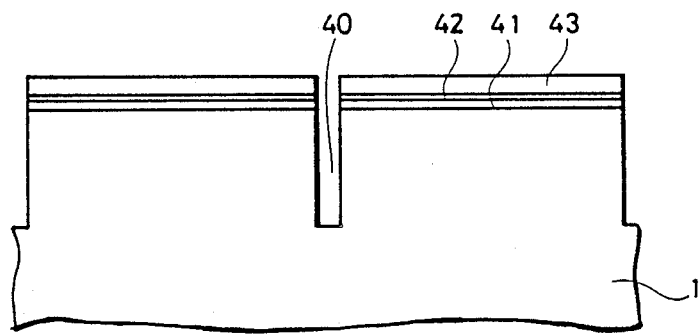

Then RIE is performed on the P-type monocrystal silicon substrate 1 through the mask of the silicon oxide film 43, to form a trench 40 of prescribed depth (FIG. 15C).

Figure 15D:
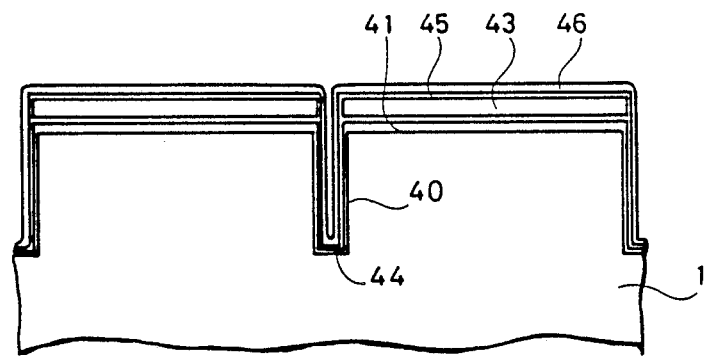

Thereafter the P-type monocrystal silicon substrate 1 is thermally oxidized in an inner region of the trench 40 to grow a thin silicon oxide film 44, and then a thin silicon nitride film 45 is formed by CVD over the entire surface including the interior of the trench 40, while a thick silicon oxide film 46 is further formed thereon also by CVD (FIG. 15D).

Figure 15E:
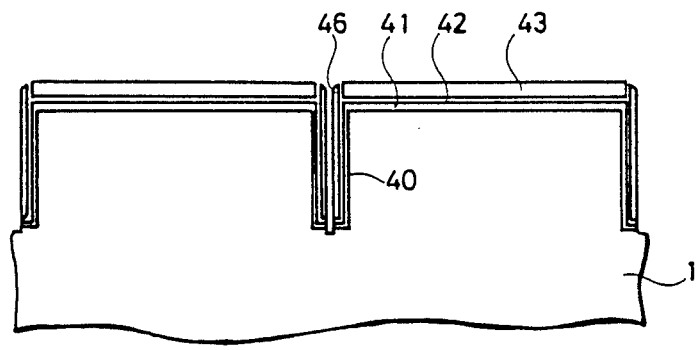
Figure 15F:
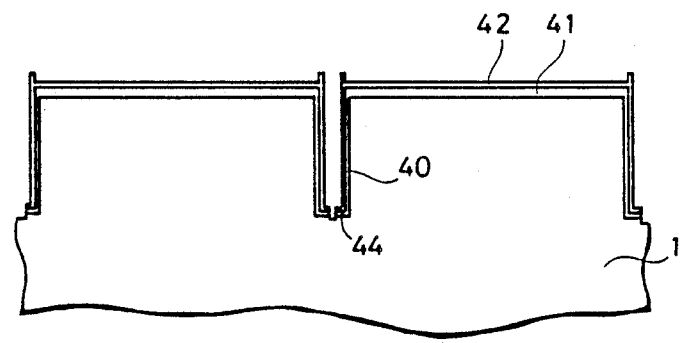

Then RIE is performed from above to remove the oxide films 44 and 46 and the nitride film 45, so that only a part of the silicon oxide film 46 formed on the sidewall surface of the trench 40 is not etched since its thickness in a vertical direction is large, to remain as a film (FIG. 15E).

Figure 15G:
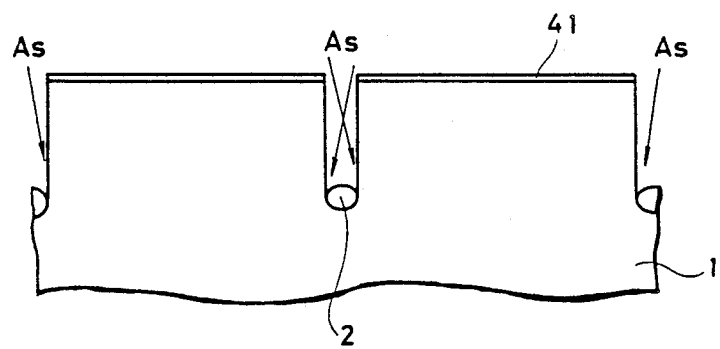

Then wet chemical etching is performed to remove the silicon oxide films 43 and 46 (FIG. 15F), and the exposed nitride film 42 is employed as a mask to form an isolation oxide film 2 by a thick silicon oxide film through thermal oxidation. Thus, the elements are isolated from each other at the bottom portion of the trench 40. The silicon nitride film 42 is then removed, and thereafter the silicon oxide film 44 in the interior of the trench 40 is removed to expose the semiconductor substrate 1 in the inner surface of the trench 40 except for the portion of the isolation oxide film 2. Then As is implanted into the silicon substrate 1 by oblique ion implantation, in order to form an impurity layer for serving as one of capacitor electrodes. The silicon oxide film 41 on each projection is rendered larger in thickness than the silicon oxide film 44 on the sidewall of the trench 40 to be left upon removal of the silicon oxide film 44, so that no As is implanted into the upper surface of the projection in this step (FIG. 15G).

The silicon oxide film 41 is removed after As implantation, and the upper surface of the projection as well as the sidewall of the trench 40, which is formed with an impurity layer 5b for serving as the other capacitor electrode, are thermally oxidized to form a thin oxide film 47. Then, a conductive polysilicon film 48 for forming a capacitor plate electrode is formed over the entire surface of the oxide film 47 including the interior of the trench 40 (FIG. 15H).

The following description is made with reference to sections taken along the lines XIII—XIII and XIV—XIV in FIG. 12.

Figure 15H:
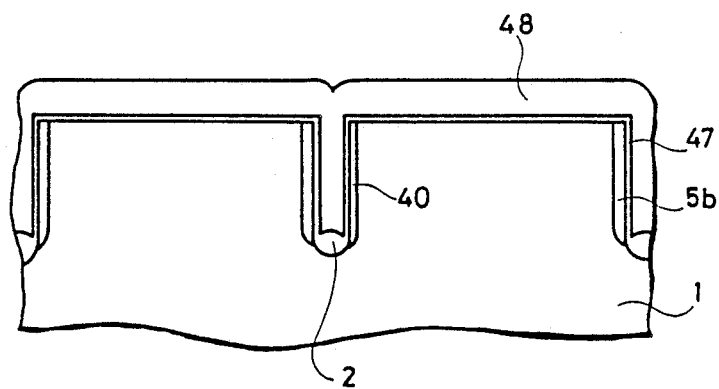
Figure 15I:
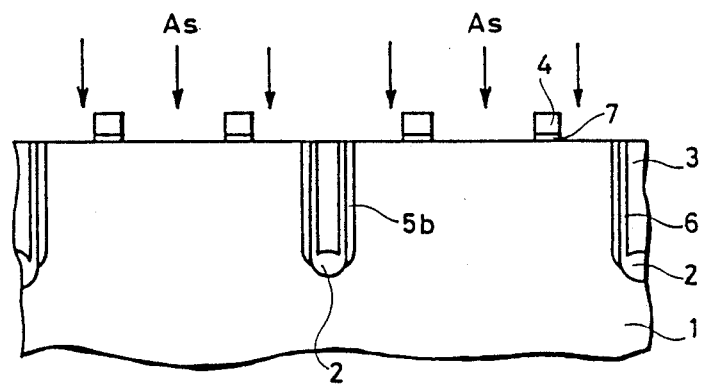
Figure 15J:
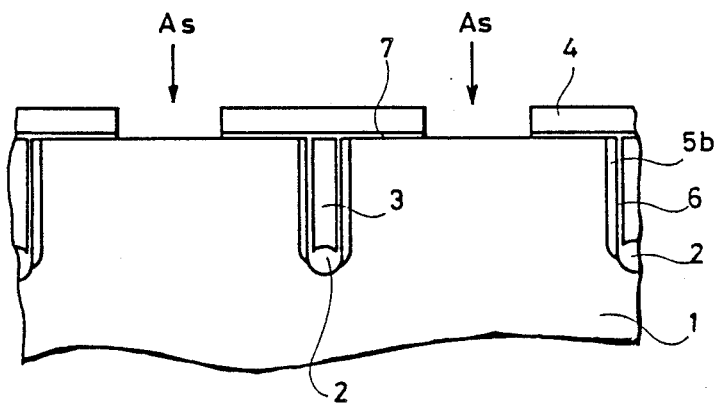

Following the step as shown in FIG. 15H, the polysilicon film 48 is etched with the oxide film 47 to be flush with the silicon substrate on the surface of the projection through a mask for leaving portions for forming gate electrodes of conductive polysilicon material by an etchback process. Then, after removing the oxide film 47, a silicon oxide film 7 for serving as a gate dielectric film is formed by thermal oxidation. Then conductive polysilicon film formed on the oxide film 7 is patterned to form the word line 4 through a photoengraving process. Then wet chemical etching is performed to remove the silicon oxide film 7 except for the portion of the polysilicon film 4. The word line 4 is employed as a mask for injecting As in order to form a source or drain region of a transistor. FIGS. 15I and 15J are sectional views taken along the lines XIII—XIII and XIV—XIV respectively, for showing this state.

Figure 15K:
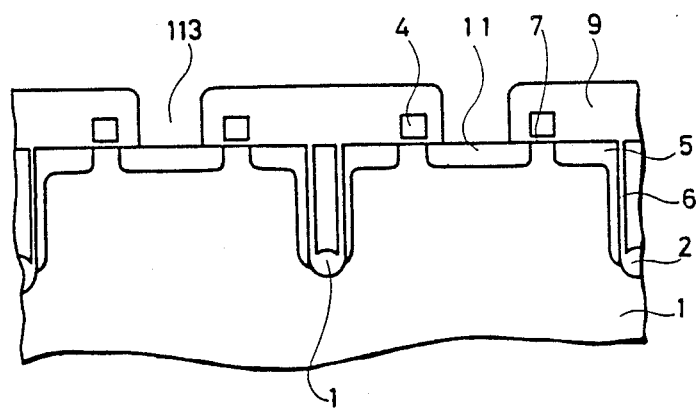
Figure 15L:
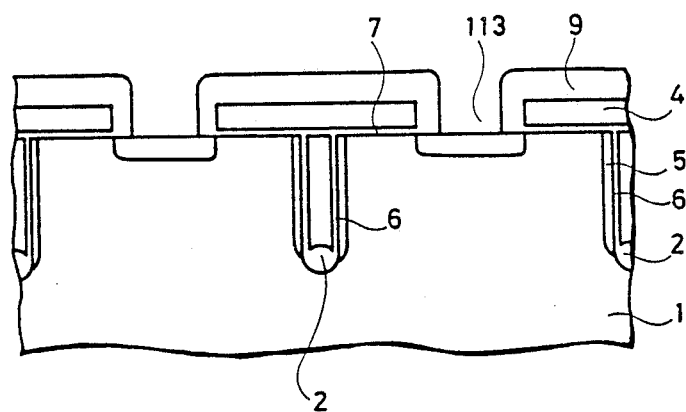

Then an interlayer isolation film 9 is deposited over the entire surface to cover the gate electrode, thereby to form a contact hole 113 for a bit line through a photoengraving process, as shown in FIGS. 15K and 15L, which are sectional views taken along the lines XIII—XIII and XIV—XIV respectively.

Finally, an aluminum film formed on the interlayer isolation film 9 for filling up the contact hole 113 is patterned to form a bit line 8, and the entire surface is covered by a surface protective coat 10 prepared by a silicon nitride film, thereby to complete the semiconductor memory device as shown in FIGS. 13 and 14, which are sectional views taken along the lines XIII—XIII and XIV—XIV.

Although each projection is cylindrically formed in the aforementioned embodiment, the same may be in the form of another protrusion such as a truncated cone, a prism, a truncated pyramid or an elliptic cylinder, to attain a similar effect. For example, if the projection is provided in the form of a prism, the cross sectional shape is the same as those shown in FIGS. 13 and 14, to attain a similar effect.

Figure 16:
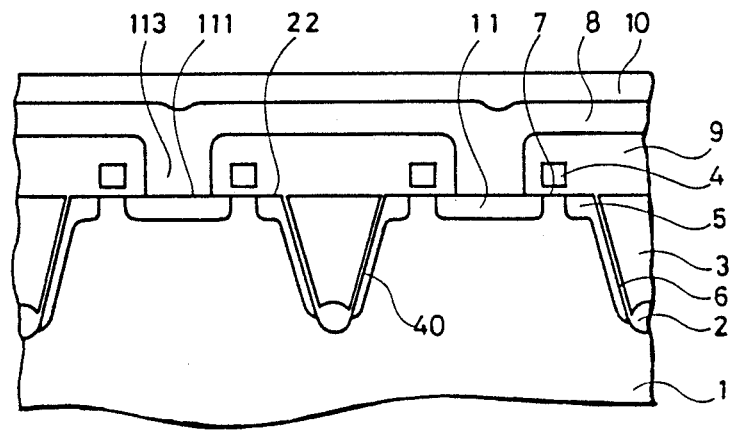
FIGS. 16 and 17 are cross sectional views showing still another embodiment corresponding to FIGS. 13 and 14, respectively.
Figure 17:
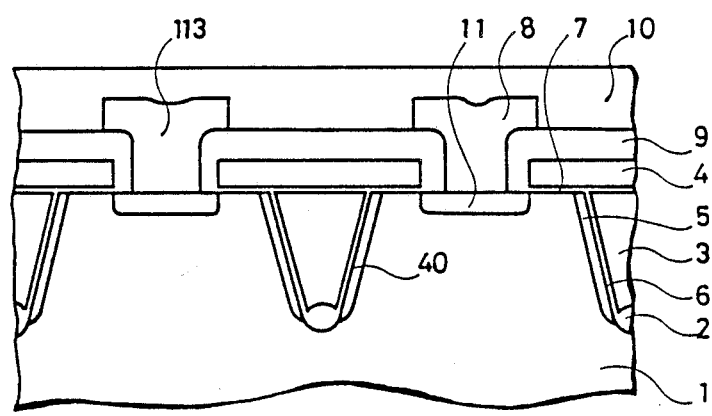

FIGS. 16 and 17 are cross sectional views of still another embodiment showing a modified example, which corresponds to FIGS. 13 and 14 according to the above described embodiment, respectively.

Structure of the present embodiment is the same as that of the above described embodiment except that projections protruding from the major surface of a semiconductor substrate are provided in the form of truncated corns. More specifically, the present invention is characterized, in that a capacitor is formed on a tapered sidewall of a projection 22.

FIGS. 18A to 18L are cross sectional views showing steps of a method for manufacturing still another embodiment of the present invention as shown in FIGS. 16 and 17.

Referring now to the figures, description is made on the manufacturing method.

Figure 18A:
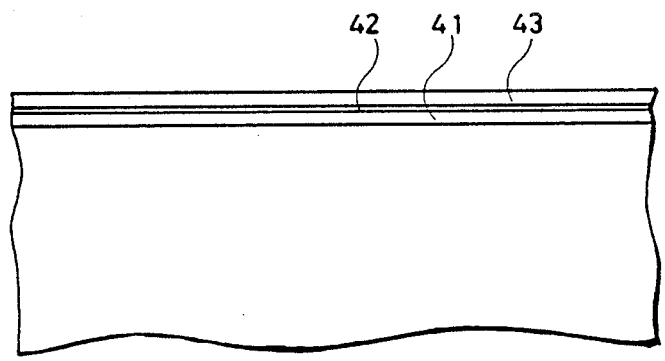
FIGS. 18A to 18L are cross sectional views showing steps of a method of manufacturing the embodiment shown in FIGS. 16 and 17.

First, a semiconductor substrate 1 is prepared by a P-type monocrystal silicon substrate, to grow a thin silicon oxide film 41 on its surface by thermal oxidation. A silicon nitride film 42 is formed thereon by CVD, and a thick silicon oxide film 43 is further formed on the same similarly by CVD (FIG. 18A).

Figure 18B:
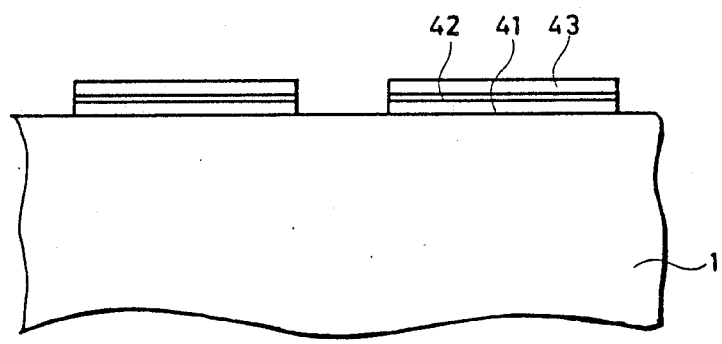

The silicon oxide films 41 and 43 and the silicon nitride film 42 are selectively removed by a photoengraving process from a region for defining a trench in a later step (FIG. 18B).

The silicon oxide film 43 left through patterning serves as a processing etching mask for providing an island-shaped protruding configuration on the P-type monocrystal silicon substrate 1.

Figure 18C:
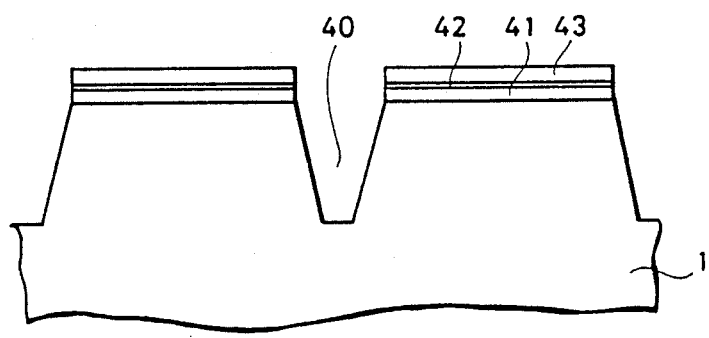

Then RIE is performed on the P-type monocrystal silicon substrate 1 through the mask of the silicon oxide film 43, to form a trench 40 having tapered sidewalls in prescribed depth FIG. 18C).

Figure 18D:
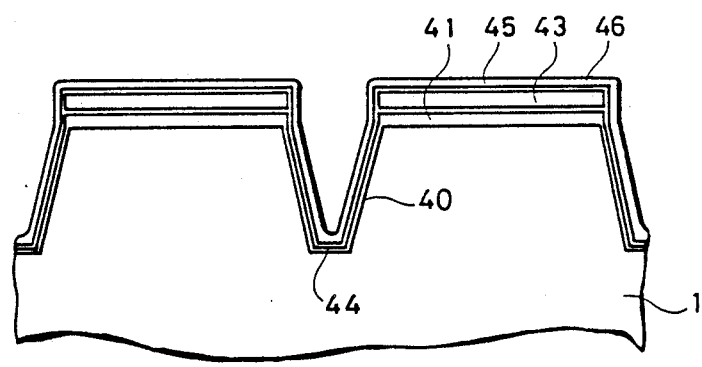

Thereafter the P-type monocrystal silicon substrate 1 is thermally oxidized in an inner region of the trench 40 to grow a thin silicon oxide film 44, and then a thin silicon nitride film 45 is formed by CVD over the entire surface including the interior of the trench 40, while a thick silicon oxide film 46 is further formed thereon also by CVD (FIG. 18D).

Figure 18E:
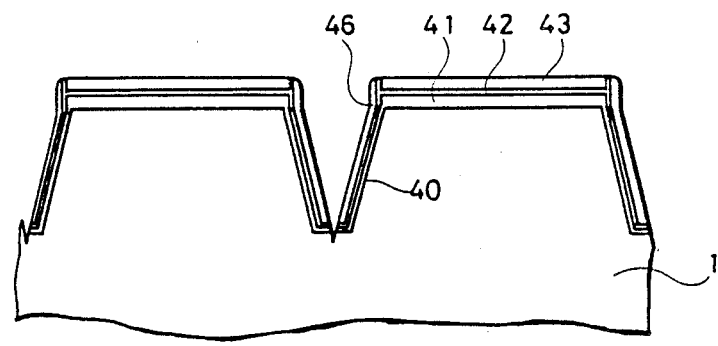
Figure 18F:
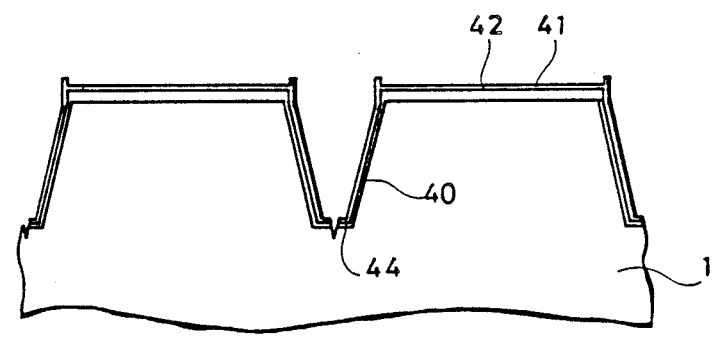

Then RIE is performed from above to remove the oxide films 44 and 46 and the nitride film 45, so that only a part of the silicon oxide film 46 formed on the sidewall surface of the trench 40 is not etched since its thickness in a vertical direction is large, to remain as a film (FIG. 18E).

Figure 18G:
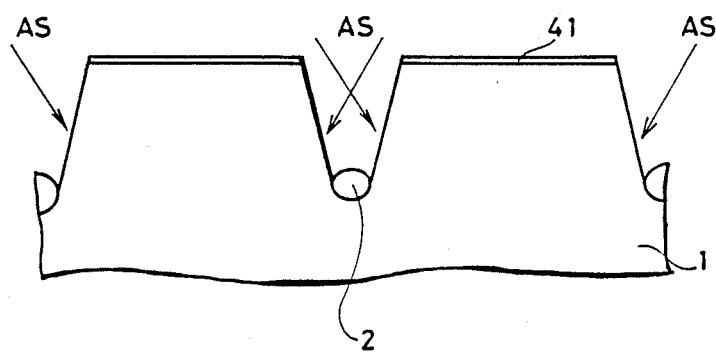

Then wet chemical etching is performed to remove the silicon dioxide films 43 and 46 (FIG. 18F), and the exposed nitride film 42 is employed as a mask to form an insolation oxide film 2 by a thick silicon oxide film through thermal oxidation. Thus, the elements are isolated from each other at the bottom portion of the trench 40. The silicon nitride film 42 is then removed and thereafter the silicon oxide film 44 in the interior of the trench 40 is removed to expose the semiconductor substrate 1 in the inner surface of the trench 40 except for the portion of the isolation oxide film 2. Then As is implanted into the silicon substrate 1 by oblique ion implantation, in order to form an impurity layer for serving as one of capacitor electrodes. The silicon oxide film 41 on each projection is rendered larger in thickness than the silicon oxide film 44 on the sidewall of the trench 40 to be left upon removal of the silicon oxide film 44, so that no As is implanted into the surface of the projection in this step (FIG. 18G).

The silicon oxide film 41 is removed after As implantation, and the upper surface of the projection as well as the sidewall of the trench 40, which is formed with an impurity layer 5b for serving as the other capacitor electrode, are thermally oxidized to form a thin oxide film 47. Then, a conductive polysilicon film 48 for forming a capacitor plate electrode is formed over the entire surface of the oxide film 47 including the interior of the trench 40 (FIG. 18H).

The following description is made with reference to sections taken along the lines XIII—XIII and XIV—XIV in FIG. 12.

Figure 18H:
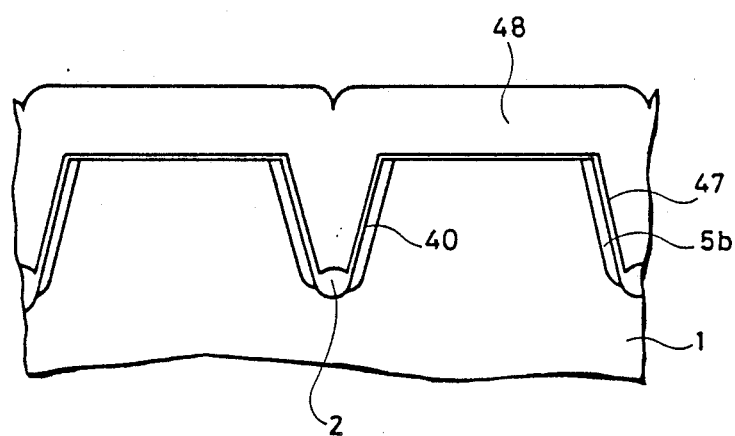
Figure 18I:
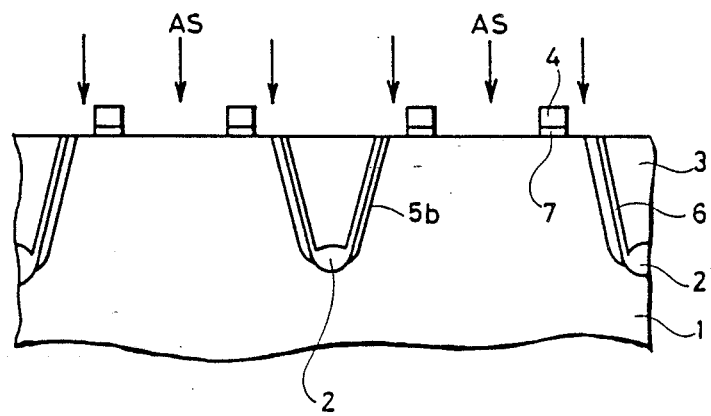
Figure 18J:
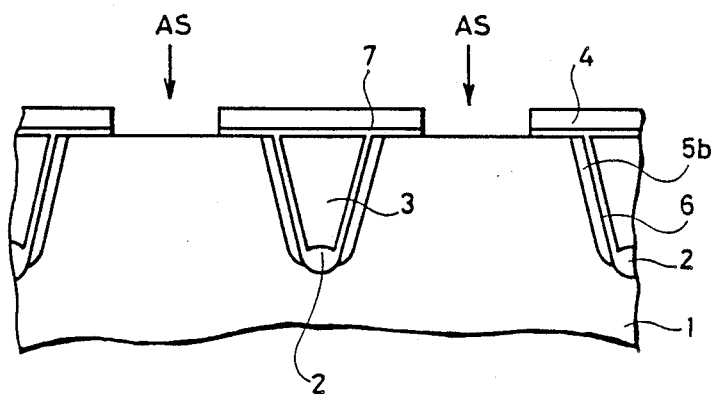

Following the step as shown in FIG. 18H, the polysilicon film 48 is etched to be flush with the silicon substrate on the surface of the projection by an etchback process. Then, the silicon oxide film 47 is removed by wet chemical etching and thereafter a silicon oxide film 7 serving as a gate dielectric film is formed by thermal oxidation. Then, a conductive polysilicon film is deposited by CVD, to form a word line 4, also serving as a gate electrode, through a photoengraving process. Then wet chemical etching is performed to remove the silicon oxide film 7 except for the portion of the polysilicon film 4. The word line 4 is employed as a mask for injecting As in order to form a source or drain region of a transistor. FIGS. 18I and 18J are cross sectional views taken along the lines XIII—XIII and XIV—XIV respectively, for showing this state.

Figure 18K:
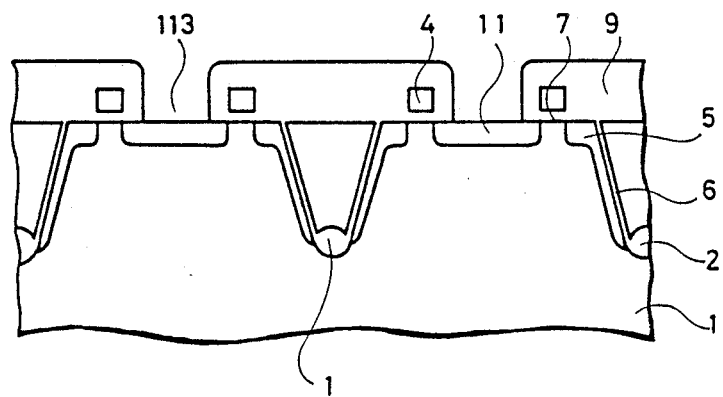
Figure 18L:
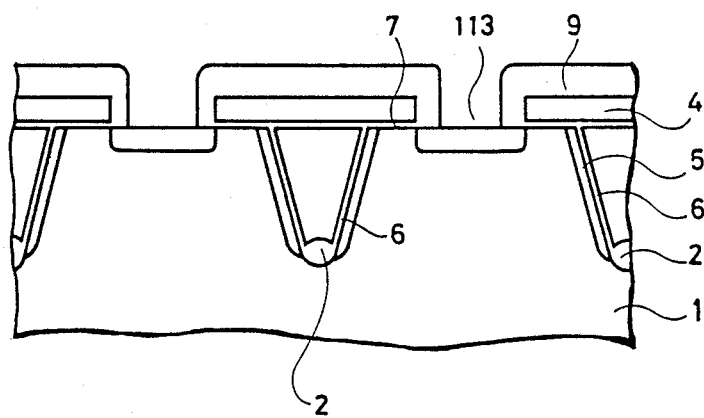

Then an interlayer isolation film 9 is deposited over the entire surface to cover the gate electrode, thereby to form a contact hole 113 for a bit line through a photoengraving process, as shown in FIGS. 18K and 18L, which are sectional views taken along the lines XIII—XIII and XIV—XIV respectively.

Finally, an aluminum film formed on the interlayer isolation film 9 for filling up the contact hole 113 is patterned to form a bit line 8, and the entire surface is covered by a surface protective coat 10 prepared by a silicon nitride film, thereby to complete the semiconductor memory device as shown in FIGS. 16 and 17, which are sectional views taken along the lines XIII—XIII and XIV—XIV respectively.

Further, although the gate electrode is provided in the form of a ring in the aforementioned embodiment, the same may not necessarily be continuous as a ring, but may be discontinuous. In this case, it is necessary that the region, which is removed the region on the projection under non continuous gate electrode from the region on the projection under ring-shaped gate electrode, should be the region for separating source and drain region.

While the major surface of the semiconductor substrate is entirely on the same plane except for the projections, the projections may be formed by regions which are isolated from other regions by ring-shaped trenches formed on the major surface of the semiconductor substrate. In this case, trenches between adjacent elements region may be independent from each other, or, each pair of ring-shaped trenches, which are partially common to each other, may be in contact with each other.

Figure 19:
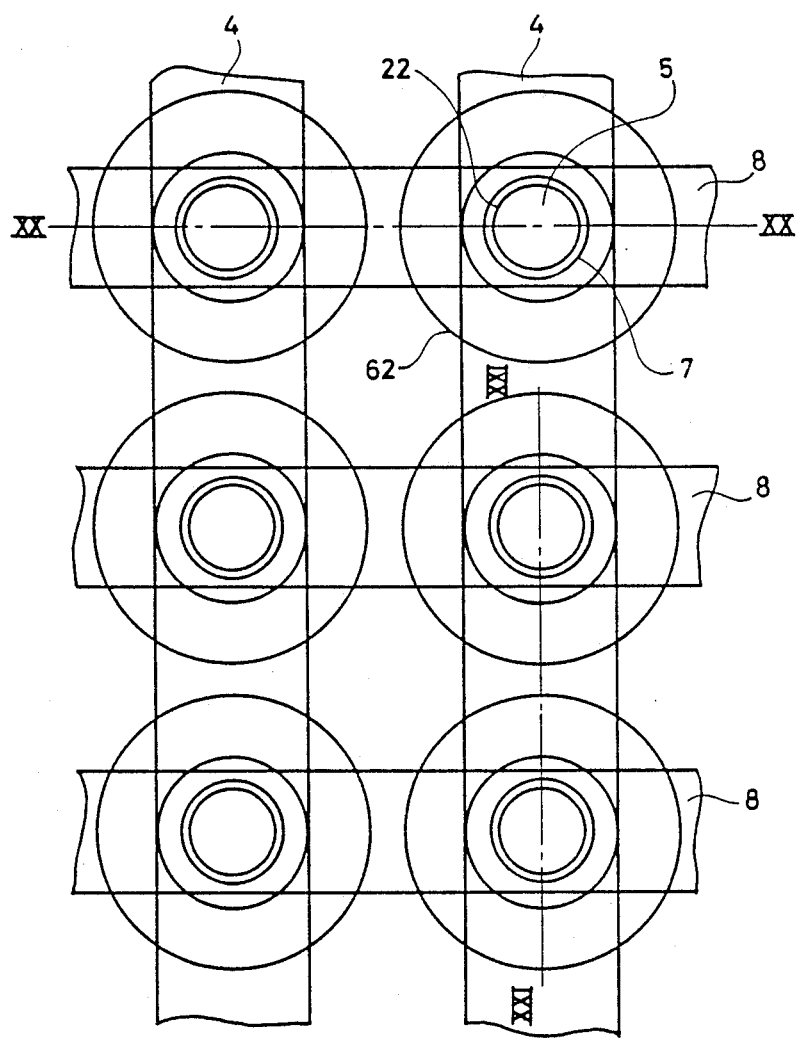
FIG. 19 illustrates plane layout of yet still another embodiment of the present invention.
Figure 20:
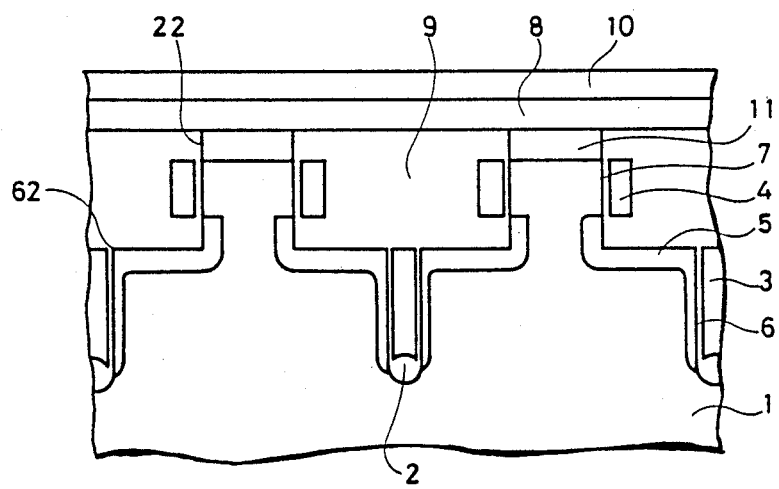
FIG. 20 is sectional view taken along the line XX—XX in FIG. 19.
Figure 21:
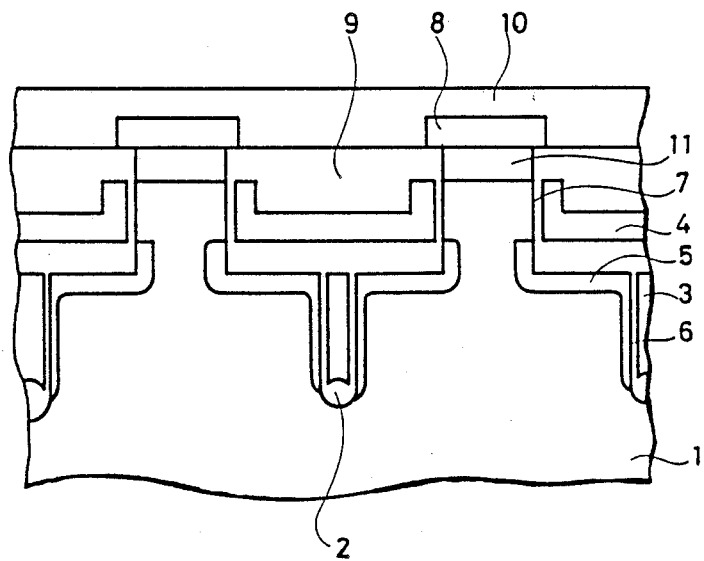
FIG. 21 is a sectional view taken along the line XXI—XXI in FIG. 19.

FIG. 19 illustrates plane layout of yet still another embodiment of the present invention, FIG. 20 is a sectional view taken along the line XX—XX in FIG. 19 and FIG. 21 is a sectional view taken along the line XXI—XXI in FIG. 19.

With reference to FIGS. 19 to 21, description is now made on the structure of this embodiment.

A semiconductor substrate 1 of silicon is provided on its major surface with island regions formed by first projections 62 having regularly cylindrically protruding surfaces, which are provided thereon with smaller second projections 22 also having cylindrically protruding surfaces. A MOS transistor (4, 5, 7, 11) is formed on the sidewall surface of each second projection 22 and a capacitor (3, 5, 6) being connected to the MOS transistor is formed in series on the sidewall of each first projection 62, with provision of a bit line 8 and a word line 4. Namely, the upper end portion of the second projection 22 is provided with an impurity diffusion layer 11 for serving as one of source or drain regions of the MOS transistor, and the word line 4 also serving as a gate electrode of the MOS transistor is provided in the form of a ring on the sidewall surface of the second projection 22 through a gate dielectric film 7. An impurity diffusion layer 5 for serving as one electrode forming the capacitor is formed on the sidewall of the first projection 62 also in integration: with a flat portion of the first projection 62, to be connected with a source or drain region of the MO transistor formed on the sidewall of the second projection 22. A cell plate 3 for serving as another electrode forming the capacitor is provided in the form of a ring on the sidewall surface of the first projection 62 through a capacitor dielectric film 6 to face the impurity diffusion layer 5, to be embedded in a trench between each pair of such first projections 62. An isolation oxide film 2 for isolating elements is formed in a bottom surface region between every pair of first projections 62. Thus, each MOS transistor substantially occupies no area in plane to contribute to increase integration density, while the cell plate 3 forming an information charge storage capacitor is provided on the sidewall of the first projection 62, i.e., on the region of the isolation oxide film 2, to also contribute to increase integration density.

Figure 22A:
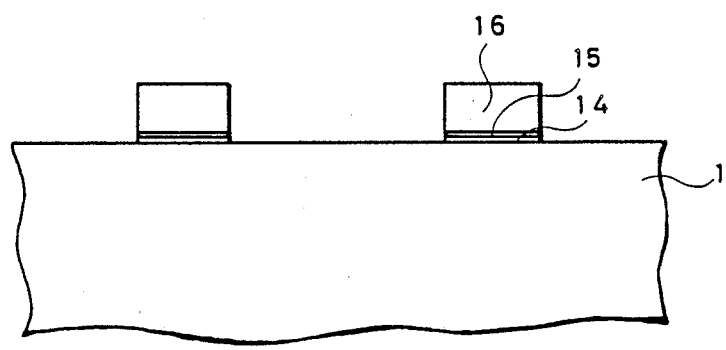
FIGS. 22A to 22R are sectional views showing steps of a method of manufacturing the embodiment shown in FIG. 19.
Figure 22B:
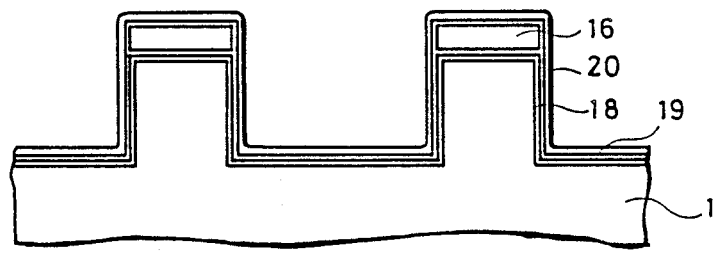
Figure 22C:
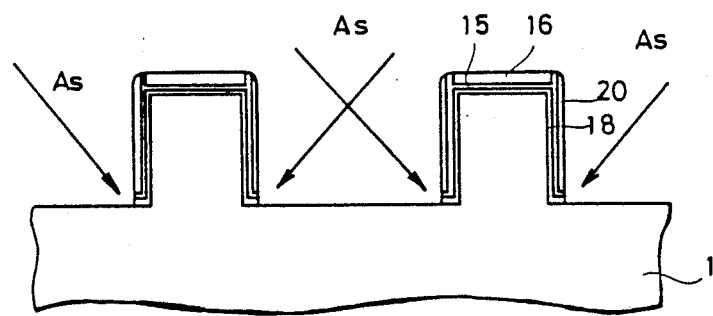
Figure 22D:
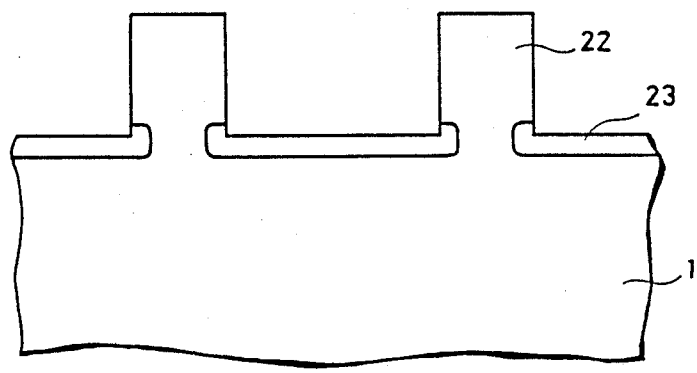
Figure 22E:
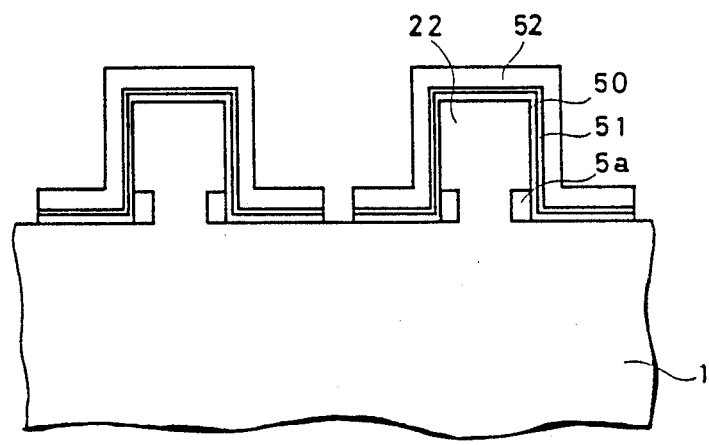
Figure 22F:
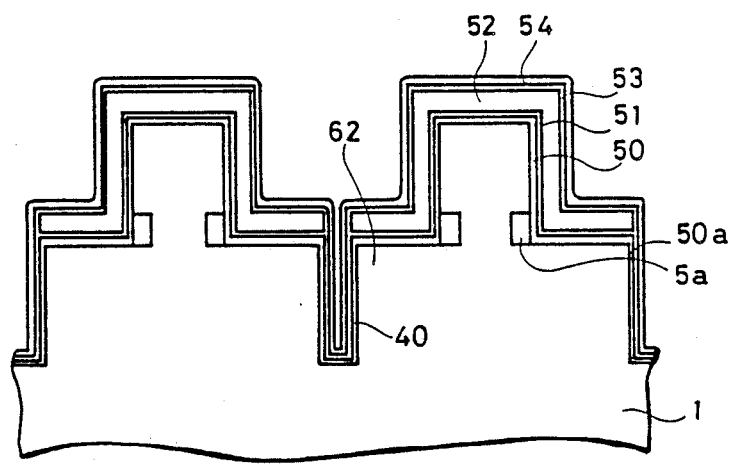
Figure 22G:
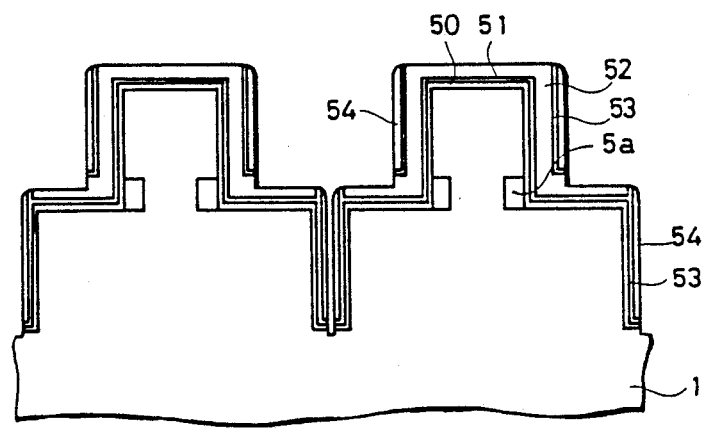
Figure 22H:
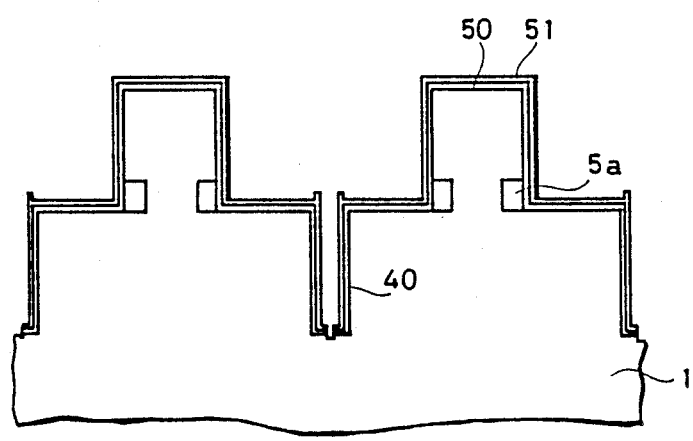
Figure 22I:
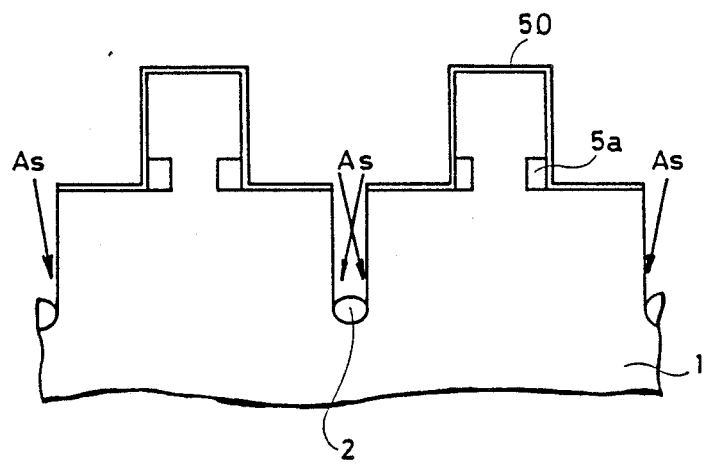
Figure 22J:
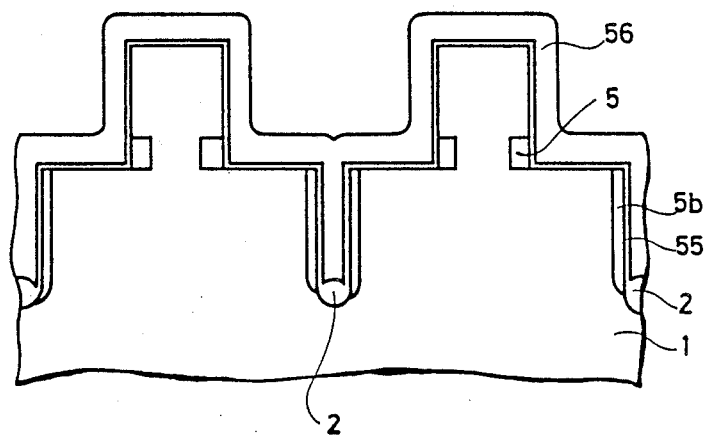
Figure 22K:
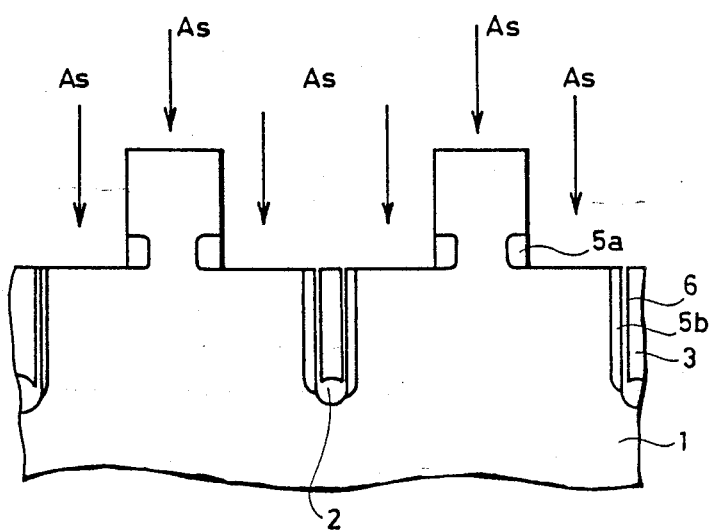
Figure 22L:
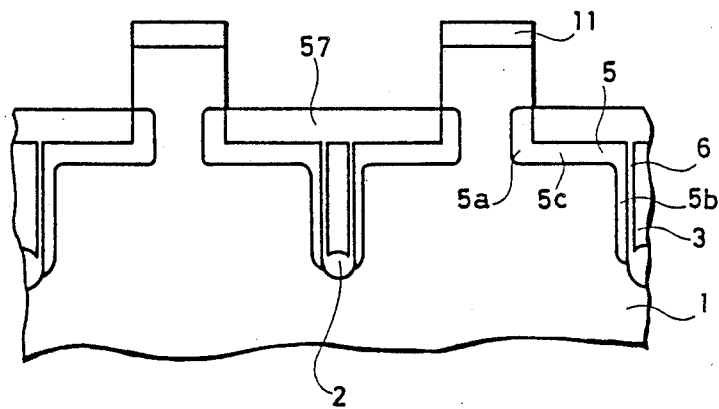
Figure 22M:
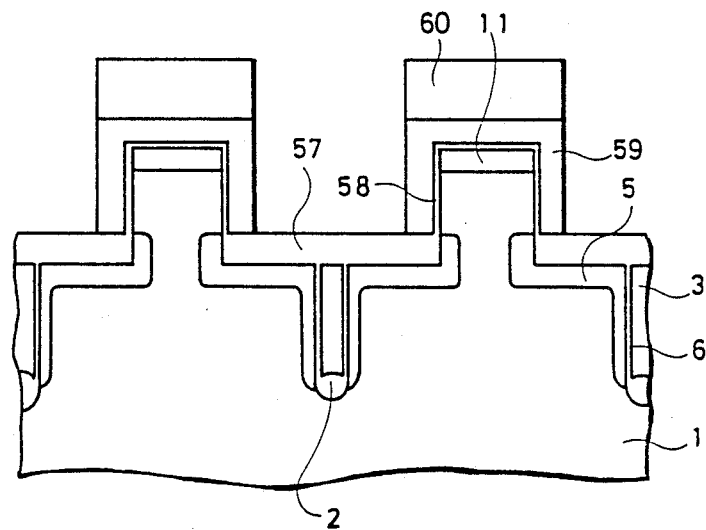
Figure 22N:
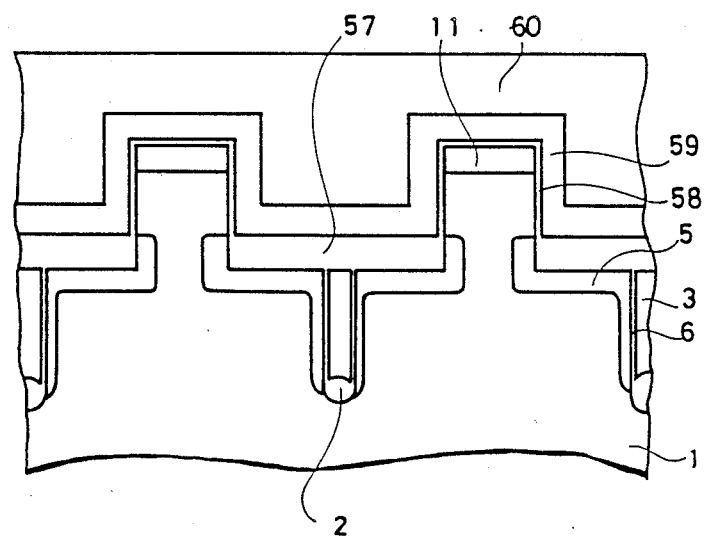
Figure 22O:
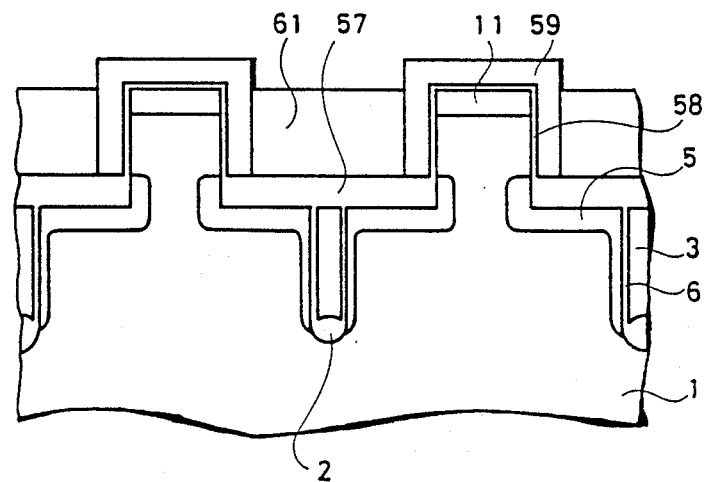
Figure 22P:
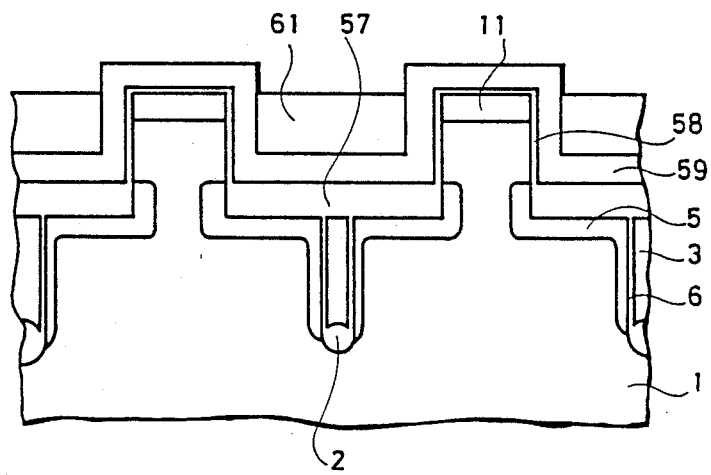
Figure 22Q:
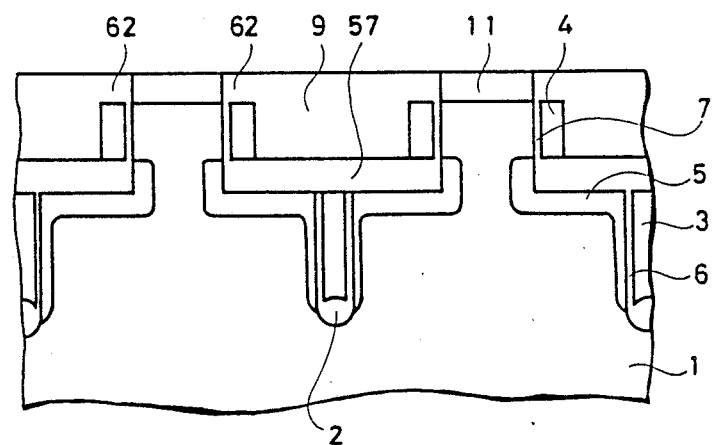
Figure 22R:
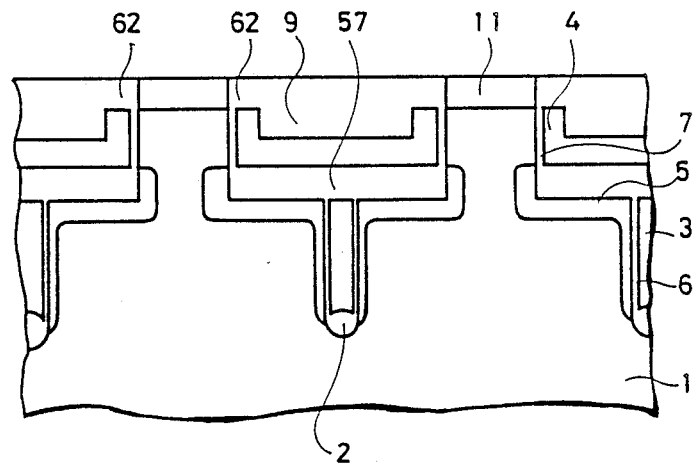

FIGS. 22A to 22R are sectional views showing steps of a method of manufacturing the embodiment as shown in FIGS. 19 to 21.

This manufacturing method is now described with reference to FIGS. 22A to 22R.

First, a semiconductor substrate 1 is prepared by a P-type monocrystal silicon substrate, to grow a thin silicon oxide film 14 on its surface by thermal oxidation. A silicon nitride film 15 is formed thereon by CVD, and a thick silicon oxide film 16 is further formed on the same also by CVD. The silicon oxide films 14 and 16 and the silicon nitride film 15 are then partially removed from regions of the semiconductor substrate 1, which are not formed with second projections, through a -photoengraving process (FIG. 22A).

The silicon oxide film 16 left through patterning serves as a processing etching mask for forming second projections as island-shaped protruding regions on the P-type monocrystal silicon substrate 1. Then RIE is performed on the P-type monocrystal silicon substrate 1 with the mask of the silicon oxide film 16, to define trenches. Then, the silicon substrate 1 is thermally oxidized in regions where the major surface thereof is exposed to define the trenches to grow a thin silicon oxide film 18, and thereafter a silicon nitride film 19 is formed over the entire surface by CVD, while a thick silicon oxide film 20 is further formed thereon also by CVD (FIG. 22B).

Then RIE is performed from above to remove the oxide films 20 and 18 and the nitride film 19 through etching, so that only the silicon oxide film 20 on the sidewall surface of each trench is not etched since its thickness in a vertical direction is large, to remain as a film. Then As is implanted by oblique ion implantation into the silicon substrate 1 exposed in the bottom surface of the trench (FIG. 22C).

Wet chemical etching is performed on the semiconductor substrate 1 which is formed with an impurity diffusion layer 23 for serving as a source or drain region by As implantation to remove the silicon oxide films 16 and 20, and thereafter the silicon substrate 1 exposed in the bottom portion of the trench is thermally oxidized to grow a thin silicon oxide film (not shown). Further, plasma etching is performed by Freon gas to remove the silicon nitride films 15 and 19, and thereafter wet chemical etching is performed to remove the silicon oxide films 14 and 18 (FIG. 22D).

Then RIE is performed to etch the silicon substrate 1 on the impurity diffusion layer 23 on the bottom surface of the trench to leave an impurity layer 5a only on the sidewall portion of a second projection 22. Then the entire free surface of the silicon substrate 1 is thermally oxidized to grow a thin silicon oxide film 50, while a silicon nitride film 51 is formed thereon by CVD and a thick silicon oxide film 52 is further formed on the same also by CVD. Then the silicon oxide films 50 and 52 and the silicon nitride film 51 are removed from prescribed regions of the semiconductor substrate 1 formed with the second projections through a photoengraving process (FIG. 22E).

The silicon oxide film 52 left through patterning serves as a processing etching mask for forming stepped first projections 62 on the silicon substrate 1.

Then RIE is performed on the silicon substrate 1 with the mask of the silicon oxide film 52, to define trenches 40. Thereafter the silicon substrate 1 is thermally oxidized in the regions where its surface is exposed to define the trenches 40 to grow a thin silicon oxide film 50a, and thereafter a silicon nitride film 53 is formed over the entire free surface by CVD, while a thick silicon oxide film 54 is formed thereon also by CVD (FIG. 22F).

Then RIE is performed from above to remove the oxide films 52 and 54 and the nitride film 53 through etching, so that only the silicon oxide film 54 on the sidewall surface of each trench 40 is not etched since its thickness in a vertical direction is large, to remain as a film (FIG. 22G).

Then wet chemical etching is performed to remove the silicon oxide films 52 and 54. The silicon nitride films 51 and 53 on the sidewall of each second projection 22 are provided in the form of a double layer, and the said etching is so controlled that the outer silicon nitride film 53 is removed with the oxide film 52 (FIG. 22H).

Then the nitride film 51 is employed as a mask to form an isolation oxide film 2 by a thick silicon oxide film through thermal oxidation on the bottom portion of the trench 40, thereby to isolate elements in the bottom portion of the trench 40. The silicon nitride film 51 is removed and then the silicon oxide film 50a is removed from the interior of the trench 40, to expose the semiconductor substrate 1 on the inner surface of the trench 40 except for the portion of the isolation oxide film 2. Further, As is implanted into the silicon substrate 1 by oblique ion implantation to form an impurity layer for serving as one of capacitor electrodes. The silicon oxide film 50 in a region other than the sidewall region of the trench 40 is rendered larger in thickness than the silicon oxide film 50a on the sidewall region of the trench 40, so that the region other than the sidewall of the trench 40 is covered by a silicon oxide film in this step, which film is employed as a mask against As implantation (FIG. 22I).

After As implantation, the silicon oxide film 50 is removed and the upper surfaces of the first and second projections, including the sidewall of the trench 40 provided with an impurity layer 5b for serving as the other capacitor electrode, are thermally oxidized to form a thin oxide film 55. Then a conductive polysilicon film 56 for serving as a capacitor plate electrode is formed over the entire surface of the oxide film 55 including the interior of the trench 40 (FIG. 22J).

Then the polysilicon film 56 is etched with the oxide film 55 to be flush with the upper surface of the first projection by an etchback process, and As is perpendicularly ion-implanted at an angle of 0° to form impurity layers for serving as source or drain regions of a transistor on respective upper surfaces of the first and second projections (FIG. 22K).

Then the upper surface of the first projection is filled up with a silicon oxide film 57 of prescribed thickness through SOG (FIG. 22L).

The following description is made with reference to sectional views taken along the lines XX—XX and XXI—XXI in FIG. 19.

In the state as shown in FIG. 22L, a silicon oxide film 58 for serving as a gate dielectric film is formed over the entire surface of the second projection through thermal oxidation, and a conductive polysilicon film 59 for serving as a word line is deposited on the same by CVD. Then the polysilicon film 59 is patterned through a multilayer resist process. A lower resist film 60 patterned by the multilayer resist process is employed as a mask to remove the polysilicon film 59 on the upper surface of the first projection 62 through RIE, as shown in FIG. 22M in section taken along the line XX—XX. FIG. 22N shows a sectional view taken along the line XXI—XXI, in which the resist film 60 is not patterned but left over the entire surface, whereby the polysilicon film 59 is not etched.

Then a silicon oxide film 61 is deposited through CVD to fill up a region between each pair of adjacent second projections, and the silicon oxide film 61 is etched, to be flush with the surface of the silicon oxide film 58 on the second projection 22 by an etchback process. FIGS. 22O and 22P are sectional views taken along the lines XX—XX and XXI—XXI respectively for showing such a state.

Then plasma etching is performed by Freon gas to etch the polysilicon film 59 exposed on the surface in prescribed depth, and a cavity in the region between each pair of adjacent second projections is filled up with a silicon oxide film 62 through SOG, as shown in FIGS. 22Q and 22R showing sectional views taken along the lines XX—XX and XXI—XXI respectively.

Finally, an aluminum film formed on the oxide film 62 is patterned to form a bit line 8, and the entire surface is covered by a surface protective coat 10 prepared by a silicon nitride film, thereby to complete the semiconductor memory device as shown in FIGS. 20 and 21, which are sectional views taken along the lines XX—XX and XXI—XXI respectively.

Although the first and second projections are cylindrically formed in the aforementioned embodiment, the same may be in the form of other protrusions such as truncated cones, prisms, truncated pyramids or elliptic cylinders, or in combination thereof, to attain a similar effect. For example, if the first and second projections are provided in the form of prisms, the cross sectional shapes are the same as those shown in FIGS. 20 and 21, to obtain a similar effect.

FIGS. 23 to 28 are cross sectional views showing a modified example according to a further embodiment.

FIGS. 23 and 24 correspond to FIGS. 20 and 21, respectively, where the first projection is provided in the form of a cylinder or a prism and the second projection is provided in the form of a truncated cone or a truncated pyramid.

Figure 25:
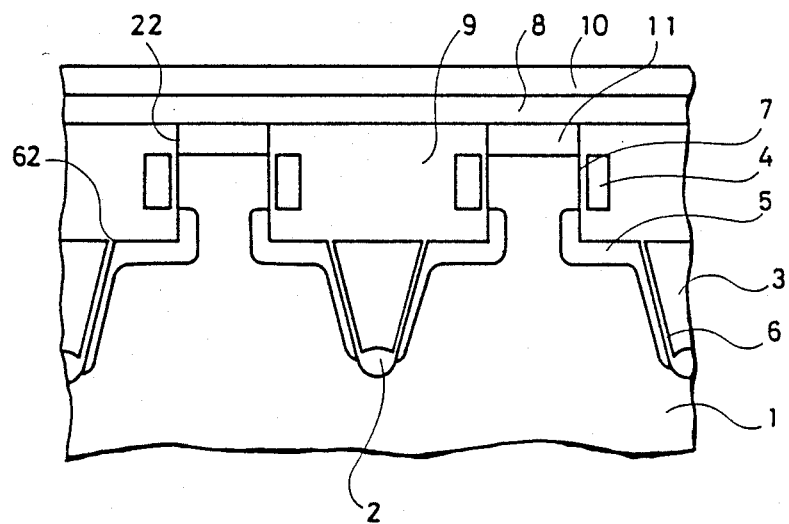
FIGS. 25 and 26 are cross sectional views showing a still further embodiment corresponding to FIGS. 20 and 21, respectively.
Figure 26:
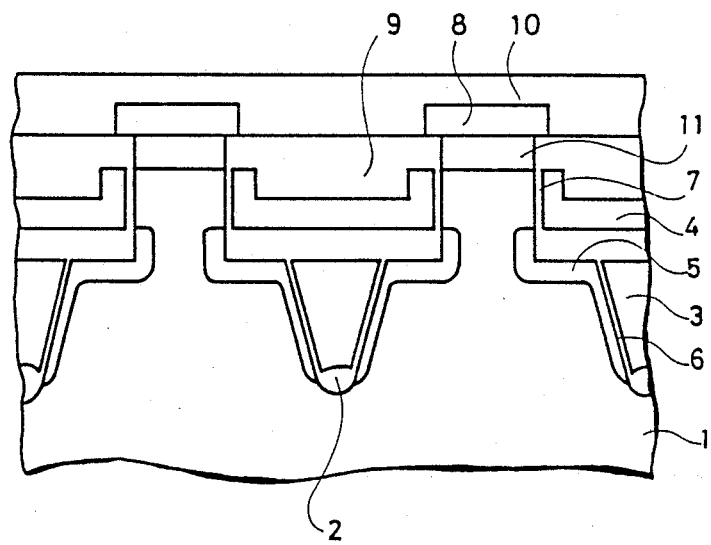

FIGS. 25 and 26 correspond to FIGS. 20 and 21, respectively, where the first projection is provided in the form of a truncated cone or a truncated pyramid and the second projection is provided in the form of a cylinder or a prism.

Figure 27:
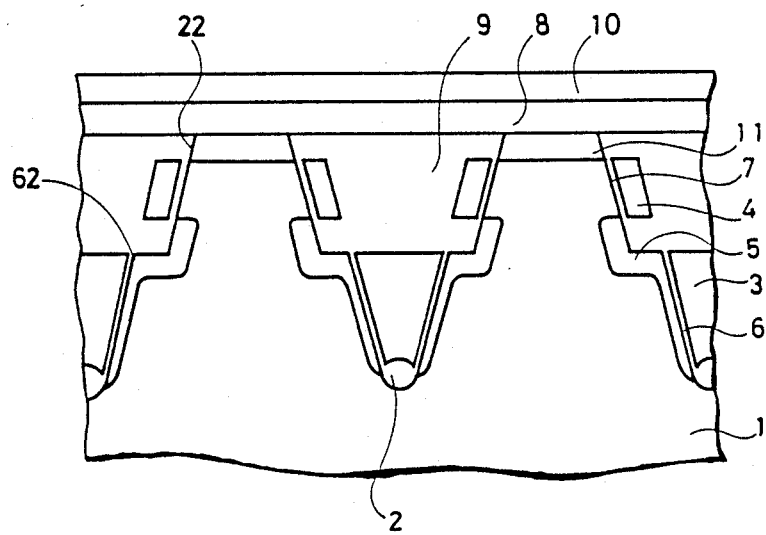
FIGS. 27 and 28 are cross sectional views showing a yet further embodiment corresponding to FIGS. 20 and 21, respectively.
Figure 28:
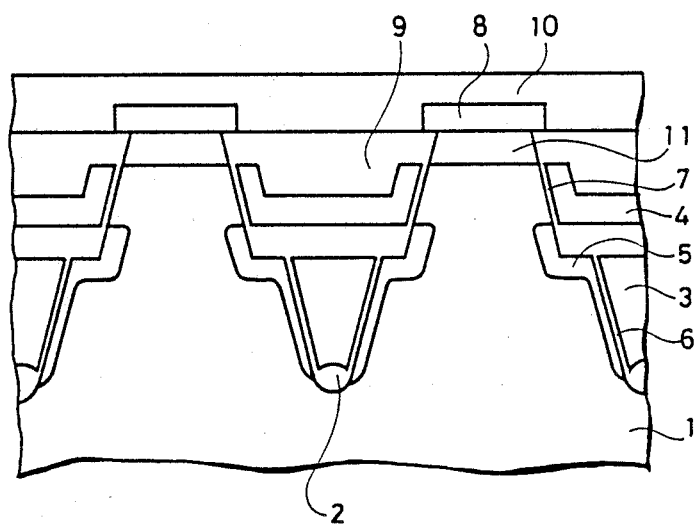

FIGS. 27 and 28 correspond to FIGS. 20 and 21, respectively, where the first projection is provided in the form of a truncated cone or a truncated pyramid and the second projection is provided in the form of a truncate cone or a truncated pyramid.

According to these embodiments, integration density is increased.

Although the gate electrode is provided in the form of a ring in the above embodiment, the same may not necessarily be continuous as a ring so far as the same is positioned around the projection. In this case, it is necessary that the region, which is removed the region on the projection under non continuous gate electrode from the region on the projection under ring-shaped gate electrode, should be the region for separating source and drain region.

While the major surface of the semiconductor substrate is entirely on the same plane except for the first projections, the first projections may be formed by regions isolated from other regions by ring-shaped trenches formed on the major surface of the semiconductor substrate. In this case, trenches between adjacent element regions may be independent of each other, or two ring-shaped trenches, which are partially common to each other, may be in contact with each other.

Further, although the capacitor is formed only on the sidewall of the first projection in the above embodiment, the same may be formed also on the upper surface of the first projection to effectively increase information storage capacity.

As shown in the foregoing embodiments, the transistor and the capacitor are formed in the form of projections formed on the major surface of the semiconductor substrate, so that integration density is increased without increasing the plane area. In addition, the semiconductor memory device is provided in high reliability by suitable arrangement of the isolation oxide film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a semiconductor substrate having a major surface and at least two projections formed on said major surface, said projections having a sidewall and an upper end portion;
a transducer formed on said sidewall of said projections, each transistor including a first impurity region formed on said upper end portion of said projections, a second impurity region formed on said sidewall of said projections separated by a prescribed region from said first impurity region, and a first electrode formed on said sidewall of said projections between said first and second impurity regions;
a capacitor formed on said major surface of said semiconductor substrate to be connected to said transistor corresponding and coupled to each of said transistors, each capacitor including a third impurity region formed on said major surface of said semiconductor substrate and coupled to said second impurity region, a first insulation film formed on said third impurity region, and a second electrode formed on said first insulation film; and
an isolation film formed on a region of said major surface of said semiconductor substrate layer between said projections and separating the third impurity regions of said capacitors.

2. A semiconductor memory device in accordance with claim 1, wherein said first electrode includes a second insulation film formed between said first electrode and said projections.

3. A semiconductor memory device in accordance with claim 1, wherein said first electrode is provided in the form of a substantially circular ring enclosing the periphery of said projections.

4. A semiconductor memory device comprising:
a semiconductor substrate having a major surface and a projection formed on said major surface, said projection having a sidewall and an upper end portion, wherein said projection is in the form of a cylinder;
a transistor formed on said sidewall of said projection; and
a capacitor formed on said major surface of said semiconductor substrate to be connected to said transistor.

5. A semiconductor memory device in accordance with claim 1, wherein
said projection is in the form of a truncated cone.

6. A semiconductor memory device in accordance with claim 1, wherein
said projection is in the form of a prism.

7. A semiconductor memory device in accordance with claim 1, wherein
said projection is in the form of a truncated pyramid.

8. A semiconductor memory device in accordance with claim 1, further including an interconnection layer which is in contact with said first impurity region on said upper end portion of said projection).

9. A semiconductor memory device in accordance with claim 1, wherein
said second impurity region is formed on the surface part of said sidewall of said projection.

10. A semiconductor memory device comprising:
a semiconductor substrate having a major surface and a projection formed on said major surface, said projection having a flat upper surface and a sidewall;
a transister formed on said upper surface of said projection, said transistor including a first impurity region formed on a central portion of said upper surface of said projection, a second impurity region formed in a partial region of the peripheral edge of said upper surface of said projection from a position separated by a prescribed distance from said first impurity region, and a first substantially circular electrode formed on said upper surface of said projection between said first and second impurity regions;

a capacitor formed on said sidewall of said projection coupled to said transistor, said capacitor including a third impurity region formed on said sidewall of said projection to be connected to said second impurity region, a first insulation film formed on said third impurity region, and a second electrode formed on said first insulation film; and an isolation film formed on a region of said major surface of said semiconductor substrate around said projection and under said capacitor.

11. A semiconductor memory device in accordance with claim 10, wherein said first electrode includes a second insulation film which is formed between said first electrode and said projection.

12. A semiconductor memory device comprising:

a semiconductor substrate having a major surface and a projection formed on said major surface, said projection having a flat upper surface and a sidewall, wherein said projection is in the form of a cylinder;

a transistor formed on said upper surface of said projection;

a capacitor formed on said sidewall of said projection to be connected to said transistor; and an isolation film formed on a region of said major surface of said semiconductor substrate around said projection and under said capacitor.

13. A semiconductor memory device in accordance with claim 10, wherein said projection is in the form of a truncated cone.

14. A semiconductor memory device in accordance with claim 10, wherein said projection is in the form of a prism.

15. A semiconductor memory device in accordance with claim 10, wherein said projection is in the form of a truncated pyramid.

16. A semiconductor memory device in accordance with claim 10, wherein at least two said projections are provided, said isolation film being an oxide film formed on a region of said major surface of said semiconductor substrate held between said projections.

17. A semiconductor memory device in accordance with claim 16, wherein said second electrode is a conductor filling up a region between a portion on said major surface of said semiconductor substrate not being provided with said projection and a position of said upper surface of said projection.

18. A semiconductor memory device comprising:

a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall;

a transducer formed on said sidewall of said second projection, said transistor including a first impurity region formed on said upper end portion of said second projection, a second impurity region formed on said sidewall of said second projection and being separated by a prescribed distance region from said first impurity region, and a first substantially circular electrode formed on said sidewall of said first projection between said first and second impurity regions;

a capacitor formed on said sidewall of said first projection to be connected to said transistor, said capacitor including a third impurity region formed on said upper surface portion and said sidewall of said first projection to be connected to said second impurity region, a first insulation film formed on said third impurity region on said sidewall, and a second electrode formed on said first insulation film; and an isolation film formed on a region of said major surface of said semiconductor substrate around said first projection and under said capacitor.

19. A semiconductor memory device in accordance with claim 18, wherein said first electrode includes a second insulation film formed between said first electrode and said second projection.

20. A semiconductor memory device comprising:

a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall, wherein said first projection is in the form of a cylinder;

a transister formed on said sidewall of said second projections;

a capacitor formed on said sidewall of said first projection to be connected to said transistor; and an isolation film formed on a region of said major surface of said semiconductor substrate around said first projection and under said capacitor.

21. A semiconductor memory device comprising:

a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall, wherein said first projection is in the form of a truncated cone;

a transducer formed on said sidewall of said second projection;

a capacitor formed on said sidewall of said first projection to be connected to said transistor; and an isolation film formed on a region of said major surface of said semiconductor substrate around said first projection and under said capacitor.

22. A semiconductor memory device comprising:

a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall, wherein said first projection is in the form of a prism;

a transducer formed on said sidewall of said second projections;

a capacitor formed on said sidewall of said first projection to be connected to said transistor; and an isolation film formed on a region of said major surface of said semiconductor substrate around said first projection and under said capacitor.

23. A semiconductor memory device comprising:
a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall, wherein said first projection is in the form of a pyramid;
a transducer formed on said sidewall of said second projection;
a capacitor formed on said sidewall of said first projection to be connected to said transistor; and
an isolation film formed on a region of said major surface of said semiconductor substrate around said first projection and under said capacitor.

24. A semiconductor memory device in accordance with claim 18, further including an interconnection layer which is in contact with said first impurity region on said upper end portion of said second projection.

25. A semiconductor memory device in accordance with claim 18, wherein
said second impurity region is formed on the surface part of said sidewall of said second projection.

26. A semiconductor memory device in accordance with claim 18, wherein
at least two pairs of said first and second projections are provided,
said isolation film being an oxide film formed on said major surface of said semiconductor substrate held between said pairs of projections.

27. A semiconductor memory device in accordance with claim 26, wherein
said second electrode is a conductor filling up a region between a portion of said major surface of said semiconductor substrate not being formed with said projections and a position of said upper surface portion of said first projection.

28. A semiconductor memory device in accordance with claim 20, wherein
said second projection is in the form of a cylinder.

29. A semiconductor memory device in accordance with claim 21, wherein
said second projection is in the form of a cylinder.

30. A semiconductor memory device in accordance with claim 22, wherein
said second projection is in the form of a cylinder.

31. A semiconductor memory device in accordance with claim 23, wherein
said second projection is in the form of a cylinder.

32. A semiconductor memory device comprising:
a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall, wherein said first projection is in the form of a cylinder and said second projection is in the form of a truncated cone;
a transducer formed on said sidewall of said second projection;
a capacitor formed on said sidewall of said first projection to be connected to said transistor; and
an isolation film formed on a region of said major surface of said semiconductor substrate around said first projection and under said capacitor.

33. A semiconductor memory device in accordance with claim 21, wherein
said second projection is in the form of a truncated cone.

34. A semiconductor memory device in accordance with claim 22, wherein
said second projection is in the form of a truncated cone.

35. A semiconductor memory device in accordance with claim 23, wherein
said second projection is in the form of a truncated cone.

36. A semiconductor memory device comprising:
a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall, wherein said first projection is in the form of a cylinder and said second projection is in the form of a truncated cone;
a transducer formed on said sidewall of said second projection;
a capacitor formed on said sidewall of said first projection to be connected to said transistor; and
an isolation film formed on a region of said major surface of said semiconductor substrate around said first projection and under said capacitor.

37. A semiconductor memory device in accordance with claim 21, wherein
said second projection is in the form of a prism.

38. A semiconductor memory device in accordance with claim 22, wherein
said second projection is in the form of a prism.

39. A semiconductor memory device in accordance with claim 23, wherein
said second projection is in the form of a prism.

40. A semiconductor memory device comprising:
a semiconductor substrate having a major surface, a first projection formed on said major surface and having a flat upper surface and a second projection formed on said first projection and being smaller than said first projection, said first projection having an upper surface portion and a sidewall, said second projection having an upper end portion and a sidewall, wherein said first projection is in the form of a cylinder and said second projection is in the form of a truncated pyramid;
a transducer formed on said sidewall of said second projection;
a capacitor formed on said sidewall of said first projection to be connected to said transistor; and
an isolation film formed on a region of said major surface of said semiconductor substrate around said first projection and under said capacitor.

41. A semiconductor memory device in accordance with claim 21, wherein
said second projection is in the form of a truncated pyramid.

42. A semiconductor memory device in accordance with claim 22, wherein
said second projection is in the form of a truncated pyramid.

43. A semiconductor memory device in accordance with claim 23, wherein
said second projection is in the form of a truncated pyramid.

* * * * *